(12) United States Patent
You

(10) Patent No.: US 10,930,350 B2
(45) Date of Patent: Feb. 23, 2021

(54) MEMORY DEVICE FOR UPDATING MICRO-CODE, MEMORY SYSTEM INCLUDING THE MEMORY DEVICE, AND METHOD FOR OPERATING THE MEMORY DEVICE

(71) Applicant: SK hynix Inc., Gyeonggi-do (KR)

(72) Inventor: Byoung Sung You, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/521,225

(22) Filed: Jul. 24, 2019

(65) Prior Publication Data

US 2020/0202932 A1 Jun. 25, 2020

(30) Foreign Application Priority Data

Dec. 20, 2018 (KR) ........................ 10-2018-0166653

(51) Int. Cl.
*G06F 9/26* (2006.01)
*G11C 15/04* (2006.01)
*G06F 12/02* (2006.01)
*G11C 11/56* (2006.01)
*G06F 8/65* (2018.01)

(52) U.S. Cl.
CPC .............. *G11C 15/046* (2013.01); *G06F 8/65* (2013.01); *G06F 9/264* (2013.01); *G06F 12/0246* (2013.01); *G11C 11/5635* (2013.01)

(58) Field of Classification Search
CPC ...... G11C 15/046; G11C 11/5635; G11C 7/20; G11C 16/20; G11C 16/16; G06F 9/264; G06F 12/0246; G06F 8/65
See application file for complete search history.

(56) References Cited

U.S. PATENT DOCUMENTS

| | | | |
|---|---|---|---|
| 6,640,334 B1* | 10/2003 | Rasmussen | G06F 8/65 717/169 |
| 2003/0163508 A1* | 8/2003 | Goodman | G06F 8/656 718/100 |
| 2007/0212026 A1* | 9/2007 | Herpel | G06F 8/65 386/247 |
| 2011/0320683 A1* | 12/2011 | Ueki | G06F 11/1441 711/102 |
| 2014/0149644 A1* | 5/2014 | Park | G06F 9/4411 711/103 |
| 2020/0012487 A1* | 1/2020 | Lin | G06F 8/65 |
| 2020/0089410 A1* | 3/2020 | Park | G11C 5/00 |

FOREIGN PATENT DOCUMENTS

| KR | 10-1605875 | 3/2016 |
|---|---|---|
| KR | 10-2016-0050707 | 5/2016 |

* cited by examiner

*Primary Examiner* — Khamdan N. Alrobaie
(74) *Attorney, Agent, or Firm* — IP & T Group LLP

(57) ABSTRACT

Provided herein may be a memory device which is capable of easily performing an update operation of a micro-code stored in the memory device. The memory device may include a first CAM block and a second CAM block, in which a micro-code is stored; and a control logic configured to control the first and second CAM blocks such that the stored micro-code is updated with a new micro-code in a micro-code update operation.

18 Claims, 16 Drawing Sheets

FIG. 13

| | PLANE0 | PLANE1 | PLANE2 | PLANE3 |
|---|---|---|---|---|
| | Items | Items | Items | Items |
| ADDITIONAL CAM Block | CNF/EXTREG RED fail Info. | PT Column Repair | PKT Column Repair<br>PKT Bad block Repair | PT Bad block Repair |
| CAM_1 | Micro Code Original Block | Micro Code Original Block | Micro Code Original Block | Micro Code Original Block |
| CAM_2 | Micro Code New Block | Micro Code New Block | Micro Code New Block | Micro Code New Block |

Concurrent 4-Plane Program

MEMORY DEVICE FOR UPDATING MICRO-CODE, MEMORY SYSTEM INCLUDING THE MEMORY DEVICE, AND METHOD FOR OPERATING THE MEMORY DEVICE

CROSS-REFERENCE TO RELATED APPLICATION

The present application claims priority under 35 U.S.C. § 119(a) to Korean patent application number 10-2018-0166653, filed on Dec. 20, 2018, which is incorporated herein by reference in its entirety.

BACKGROUND

Field of Invention

The present disclosure generally relates to an electronic device, and more particularly, to a memory device, a memory system including the memory device, and a method for operating the memory device.

Description of Related Art

The paradigm for the recent computer environment has been turned into a ubiquitous computing environment in which computing systems can be used anywhere and anytime. This promotes increasing usage of portable electronic devices such as mobile phones, digital cameras, notebook computers, and the like. Such portable electronic devices may generally include a memory system using a memory device, i.e., a data storage device. The data storage device is used as a main memory device or an auxiliary memory device of the portable electronic devices.

A data storage device using a memory device has excellent stability and durability, high information access speed, and low power consumption, since there is no mechanical driving part. In an example of memory systems having such advantages, the data storage device includes a Universal Serial Bus (USB) memory device, memory cards having various interfaces, a Solid State Drive (SSD), and the like.

The memory device is generally classified into a volatile memory device and a nonvolatile memory device.

The nonvolatile memory device has relatively slow write and read speeds, but retains stored data even when the supply of power is interrupted. Thus, the nonvolatile memory device is used to store data to be retained regardless of whether power is supplied.

Examples of the nonvolatile memory include a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is classified into a NOR type flash memory and a NAND type flash memory.

SUMMARY

Embodiments provide a memory device capable of easily performing an update operation of a micro-code stored in a semiconductor memory, a memory system including the memory device, and a method for operating the memory device.

In accordance with an aspect of the present disclosure, there is provided a memory device including: a first CAM block and a second CAM block, in which a micro-code is stored; and a control logic configured to control the first and second CAM blocks such that the stored micro-code is updated with a new micro-code in a micro-code update operation, wherein the control logic includes: a command interface configured to control program and read operations of the first CAM block and the second CAM block in response to a command received from the outside; a first memory configured to store an algorithm for performing the read operation of the micro-code stored in the first CAM block, and output read only memory (ROM) data, based on the algorithm, in an initialization operation; a second memory configured to store the micro-code read from the first CAM block in the initialization operation, and output random access memory (RAM) data, based on the stored micro-code; a selection circuit configured to select and output the ROM data output from the first memory in the initialization operation, and select and output the RAM data output from the second memory in a normal operation; and an instruction decoder configured to receive the ROM data or the RAM data, which is output from the selection circuit, to generate control signals for performing an operation.

In accordance with another aspect of the present disclosure, there is provided a memory system including: a memory device including a plurality of semiconductor memories, wherein each of the plurality of semiconductor memories performs an operation based on a micro-code; and a controller configured to receive a micro-code update command and a new micro-code from a host, and transmit the micro-code update command and the new micro-code to the memory device, wherein each of the plurality of semiconductor memories stores the new micro-code received from the controller in first and second CAM blocks in a micro-code update operation, and reads the new micro-code stored in the first CAM block and then load the read new micro-code into an algorithm dedicated random access memory (RAM) in an initialization operation.

In accordance with still another aspect of the present disclosure, there is provided a method for operating a memory device, the method including: receiving a micro-code update command and a new micro-code from a host; storing the new micro-code in a second CAM block of a semiconductor memory in response to the micro-code update command; and performing an operation of erasing a first CAM block in which an original micro-code is stored, and copying the new micro-code from the second CAM block to the first CAM block.

In accordance with still another aspect of the present disclosure, there is provided a method for operating a memory device, the method including: performing a read operation of a CAM block in which a micro-code is stored, based on an algorithm stored in a CAM read dedicated ROM in an initialization operation; storing the micro-code read from the CAM block in an algorithm dedicated RAM; and controlling a peripheral circuit, based on the micro-code stored in the algorithm dedicated RAM in a general operation.

In accordance with still another aspect of the present disclosure, there is provided a method for operating a memory device, the method including: buffering, by a controller, a second code provided from an external; programming, by a memory device, the second code into a second memory block; erasing, by the memory device, a first code programmed in a first memory block; copying, by the memory device, the second code from the second memory block into the first memory block; and loading, by the memory device, the second code from one or more between the first and second memory block thereby running the memory device based on the loaded second code, wherein the second code is buffered and programmed according to a majority check scheme.

BRIEF DESCRIPTION OF THE DRAWINGS

Example embodiments will now be described more fully hereinafter with reference to the accompanying drawings; however, the examples may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 13 is a mapping table of a micro-code.

DETAILED DESCRIPTION

Figure 1:
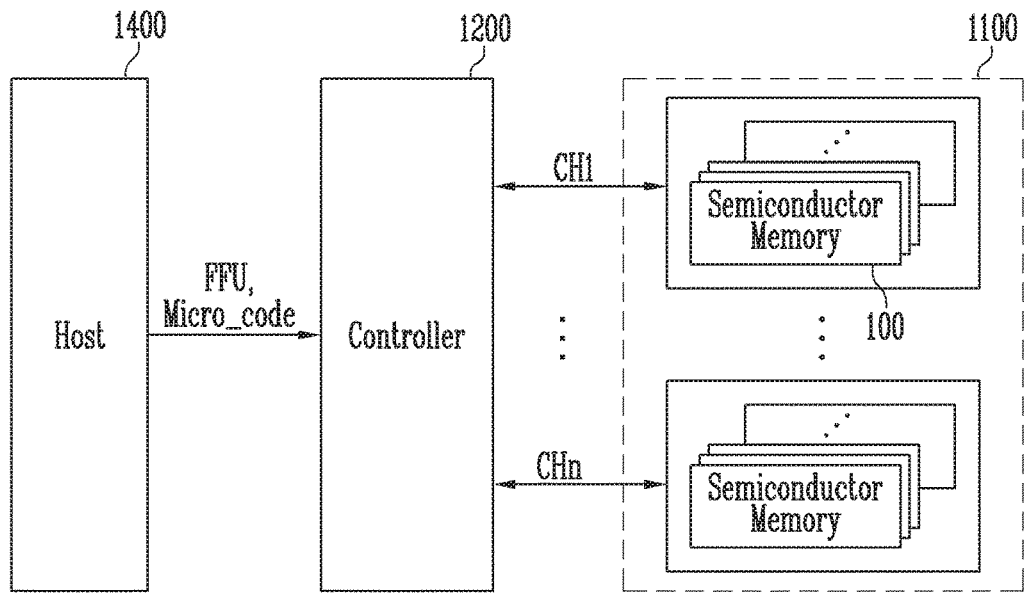
FIG. 1 is a block diagram illustrating a memory system in accordance with an embodiment of the present disclosure.

The specific structural or functional description disclosed herein is merely illustrative for the purpose of describing embodiments in accordance with the concept of the present disclosure. The embodiments in accordance with the concept of the present disclosure can be implemented in various forms, and cannot be construed as limited to the embodiments set forth herein.

The embodiments in accordance with the concept of the present disclosure can be variously modified and have various shapes. Thus, the embodiments are illustrated in the drawings and are intended to be described herein in detail. However, the embodiments in accordance with the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

So far as not being differently defined, all terms used herein including technical or scientific terminologies, have meanings that are commonly understood by those skilled in the art to which the present disclosure pertains. The terms as defined in the dictionary should be understood such that they have meanings consistent with the context of the related technique. So far as not being clearly defined in this application, terms should not be understood in an ideally or excessively formal way.

In describing those embodiments, description will be omitted for techniques that are well known to the art to which the present disclosure pertains, and are not directly related to the present disclosure. The intent is to disclose the gist of the present disclosure more clearly by omitting unnecessary description.

Hereinafter, exemplary embodiments of the present disclosure will be described in detail with reference to the accompanying drawings in order for those skilled in the art to be able to readily implement the technical spirit of the present disclosure.

FIG. 1 is a block diagram illustrating a memory system in accordance with an embodiment of the present disclosure.

Referring to FIG. 1, the memory system 1000 includes a memory device 1100 and a controller 1200. The memory device 1100 includes a plurality of semiconductor memories 100. Semiconductor memories 100 sharing one channel are grouped as one group, so that the plurality of semiconductor memories 100 can be divided into a plurality of groups.

FIG. 1 illustrates that the plurality of groups communicate with the controller 1200 respectively through first to nth channels CH1 to CHn. Each semiconductor memory 100 will be described later with reference to FIG. 3.

Each group communicates with the controller 1200 through one common channel. The controller 1200 controls the plurality of semiconductor memories 100 of the memory device 1100 through the plurality of channels CH to CHn.

The controller 1200 is coupled between a host 1400 and the memory device 1100. The controller 1200 accesses the memory device 1100 in response to a request from the host 1500. For example, the controller 1200 controls read, write, erase, and background operations of the memory device 1100 in response to a request received from the host 1400. The controller 1200 provides an interface between the memory device 1100 and the host 1400. The controller 1200 drives firmware for controlling the memory device 1100.

The host 1400 controls the memory system 1000. The host 1400 includes portable electronic devices such as a computer, a PDA, a PMP, an MP3 player, a camera, a camcorder, and a mobile phone. The host 1400 may request a write operation, a read operation, an erase operation, etc. of the memory system 1000 through a command.

Each of the plurality of semiconductor memories 100 included in the memory device 1100 of the memory system 1000 includes a control logic that stores an algorithm for performing a general operation.

The memory system 1000 in accordance with the embodiment of the present disclosure may perform a micro-code update operation for correcting and changing the algorithms stored in the semiconductor memories 100.

The controller 1200 may receive a command FFU for requesting the micro-code update operation and a micro-code Micro_code from the host 1400 in the micro-code update operation, and store the micro-code Micro_code in a Content Addresable Memory (CAM) of a selected semiconductor memory 100 in the command FFU.

The micro-code update operation of the memory system 1000 will be described later.

The controller 1200 and the memory device 1100 may be integrated into one semiconductor device. In an exemplary embodiment, the controller 1200 and the memory device 1100 may be integrated into one semiconductor device, to constitute a memory card. For example, the controller 1200 and the memory device 1100 may be integrated into one semiconductor device, to constitute a memory card such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD card (SD, miniSD, microSD or SDHC), or a Universal Flash Storage (UFS).

The controller 1200 and the memory device 1100 may be integrated into one semiconductor device to constitute a semiconductor drive (e.g., Solid State Drive (SSD)). The semiconductor drive SSD includes a storage device configured to store data in a semiconductor memory. When the memory system 1000 is used as the semiconductor drive SSD, the operating speed of the host 1400 coupled to the memory system 1000 can be remarkably improved.

In another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multi-Media Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an exemplary embodiment, the memory device 1100 or the memory system 1000 may be packaged in various forms. For example, the memory device 1100 or the memory system 1000 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), Plastic Metric Quad Flat Pack (PMQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), System In Package (SIP), Multi-Chip Package (MCP), Wafer-level Fabricated Package (WFP), or Wafer-level processed Stack Package (WSP).

Figure 2:
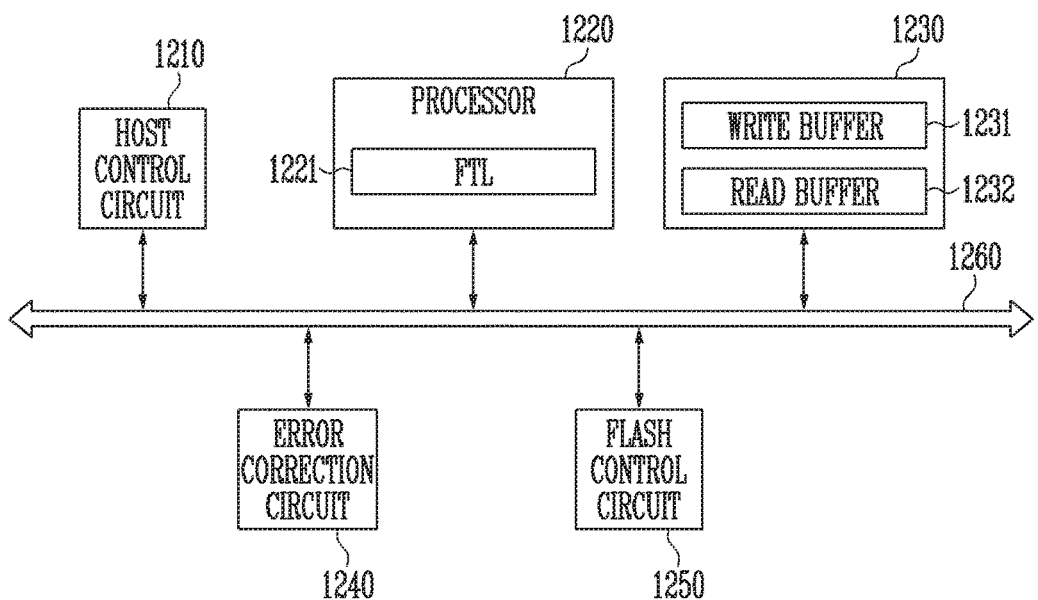
FIG. 2 is a block diagram illustrating a configuration of a controller shown in FIG. 1.

FIG. 2 is a block diagram illustrating a configuration of the controller shown in FIG. 1.

Referring to FIG. 2, the controller 1200 may include a host control circuit 1210, a processor 1220, a memory buffer 1230, an error correction circuit 1240, a flash control circuit 1250, and a bus 1260.

The bus 1260 may provide a channel between components of the controller 1200.

The host control circuit 1210 may control an operation of queuing commands in a mail box by parsing a command received from the host 1400, and buffering data received from the host 1400 in the memory buffer 1230 by transmitting the data to the memory buffer 1230. In another example, the host control circuit 1210 may control an operation of outputting data buffered in the memory buffer 1230 to the host 1400. The host control circuit 1210 may operate according to protocol firmware.

The processor 1220 may control the overall operations of the controller 1200, and perform a logical operation. The processor 1220 may communicate with the host 1400 shown in FIG. 1 through the host control circuit 1210, and communicate with the memory device 1100 shown in FIG. 1 through the flash control circuit 1250. Also, the processor 1220 may control the memory buffer 1230. The processor 1220 may control an operation of the memory system 1000 by using the memory buffer 1230 as a working memory, cache memory, or buffer memory.

The processor 1220 may include a Flash Translation Layer (hereinafter, referred to as 'FTL') 1221. The FTL 1221 drives firmware stored in the memory buffer 1230. Also, the FTL 1221 perform processing in response to commands queued in a mail box, and generates a descriptor corresponding to the queued commands and then transmits the generated descriptor to the flash control circuit 1250. Also, the FTL 1221 may map an address such that micro-codes received from the host 1400 are stored in a CAM block of a selected semiconductor memory.

The memory buffer 1230 may be used as a working memory, cache memory, or data buffer memory of the processor 1220. The memory buffer 1230 may store codes and commands, which are executed by the processor 1220. The memory buffer 1230 may include a write buffer 1231 and a read buffer 1232. The write buffer 1231 may buffer and store a micro-code received under the control of the host control circuit 1210.

The memory buffer 1230 may include a Static RAM (SRAM) or Dynamic RAM (DRAM).

The error correction circuit 1240 may perform an error correction operation. The error correction circuit 1240 may perform Error Correction Code (ECC) encoding by receiving a micro-code stored in the memory buffer 1230. Also, the error correction circuit 1240 may scramble the encoded micro-code. In a read operation, the error correction circuit 1240 may detect and correct an error of data received from the semiconductor memory 100, using an ECC, and descramble the data.

The flash control circuit 1250 generates and outputs an internal command for controlling the memory device 1100 in response to the descriptor generated by the processor 1220. In a micro-code update operation, the flash control circuit 1250 may transmit, to the memory device 1100, the micro-code transmitted from the memory buffer 1230 to be encoded and scrambled by the error correction circuit 1240 together with the internal command. In another example, the flash control circuit 1250 may control an operation of buffering data read and output from the memory device 1100 to the memory buffer 1230 in response to the descriptor in the read operation. The flash control circuit 1250 may include a flash interface.

Figure 3:
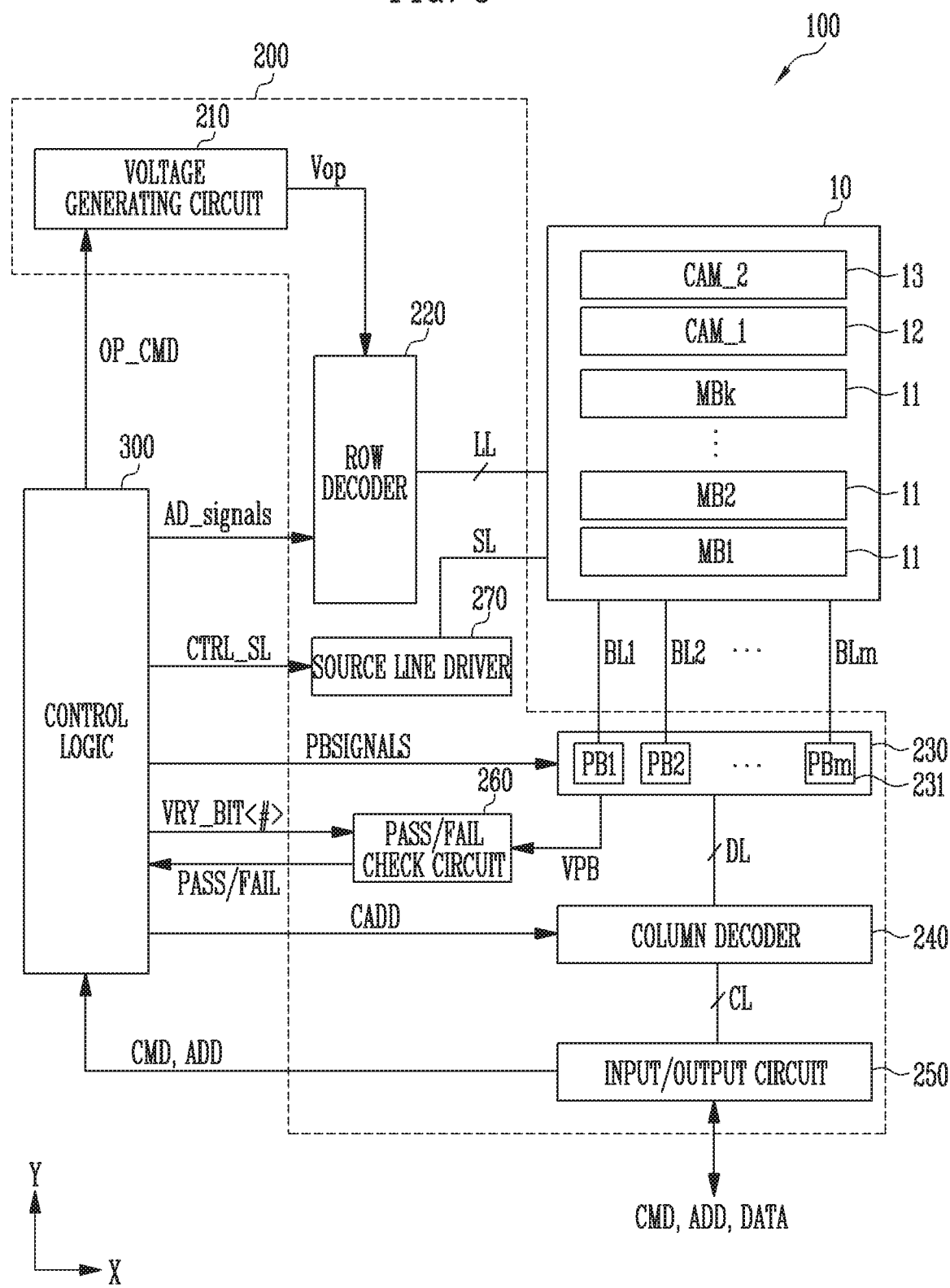
FIG. 3 is a diagram illustrating a semiconductor memory shown in FIG. 1.

FIG. 3 is a diagram illustrating the semiconductor memory 100 shown in FIG. 1.

Referring to FIG. 3, the semiconductor memory 100 may include a memory cell array 10 that stores data. The semiconductor memory 100 may include a peripheral circuit 200 configured to perform a program operation for storing data in the memory cell array 10, a read operation for outputting the stored data, and an erase operation for erasing the stored data. The semiconductor memory 100 may include a control logic 300 that controls the peripheral circuit 200 under the control of the controller 1200 shown in FIG. 1.

The memory cell array 10 may include a plurality of memory blocks MB1 to MBk (k is a positive integer) 11 and a plurality of CAM blocks CAM_1 and CAM_2 12 and 13. Local lines LL and bit lines BL1 to BLm (m is a positive integer) may be coupled to the memory blocks MB1 to MBk 11. For example, the local lines LL may include a first select line, a second select line, and a plurality of word lines arranged between the first and second select lines. Also, the local lines LL may further include dummy lines arranged between the first select line and the word lines, and between the second select line and the word lines. The first select line may be a source select line, and the second select line may be a drain select line. For example, the local lines LL may include word lines, drain and source select lines, and source lines SL. For example, the local lines LL may further include dummy lines. For example, the local lines LL may further include pipe lines. The local lines LL may be coupled to the memory blocks MB1 to MBk 11, respectively, and the bit lines BL1 to BLm may be commonly coupled to the memory blocks MB1 to MBk 11. The memory blocks MB1 to MBk 11 may be implemented in a two-dimensional or three-dimensional structure. For example, memory cells may be arranged in a direction parallel to a substrate in memory blocks 11 having a two-dimensional structure. For example, memory cells may be arranged in a direction vertical to a substrate in memory blocks 11 having a three-dimensional structure.

Each of the plurality of CAM blocks CAM_1 and CAM_2 12 and 13 may include a plurality of CAM cells and a read & write circuit for performing program and read operations on the CAM cells. A first CAM block CAM_1 among the plurality of CAM blocks CAM_1 and CAM_2 12 and 13 may store a micro-code, and a second CAM block CAM_2 among the plurality of CAM blocks CAM_1 and CAM_2 12 and 13 may be an erase block in which no data is stored. In a micro-code update operation, the second CAM block CAM_2 stores a new micro-code, and the micro-code stored in the first CAM block CAM_1 is erased. Subsequently, the new micro-code stored in the second CAM block CAM_2 may be copied to the first CAM block CAM_1, and the new micro-code stored in the second CAM block CAM_2 is not erased but may remain.

In a CAM data read operation, the micro-code stored in the first CAM block CAM_1 is read to be transmitted to the control logic 300.

The peripheral circuit 200 may be configured to perform program, read, and erase operations of a selected memory block 11 or a selected CAM block 12 or 13 under the control of the control logic 300. For example, the peripheral circuit 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop used for program, read, and erase operations in response to an operation signal OP_CMD. Also, the voltage generating circuit 210 may selectively discharge the local lines LL in response to the operation signal OP_CMD. For example, the voltage generating circuit 210 may generate a program voltage, a verify voltage, a pass voltage, and a select transistor operation voltage under the control of the control logic 300.

The row decoder 220 may transfer the operating voltages Vop to local lines LL coupled to the selected memory block 11 in response to row decoder control signals AD_signals. For example, the row decoder 220 may selectively apply operation voltages (e.g., a program voltage, a verify voltage, a pass voltage, and the like) generated by the voltage generating circuit 210 to word lines among the local lines LL in response to the row decoder control signals AD_signals.

In a program voltage applying operation, the row decoder 220 applies a program voltage generated by the voltage generating circuit 210 to a selected word line among the local lines LL in response to the row decoder control signals AD_signals, and applies a pass voltage generated by the voltage generating circuit 210 to the other unselected word lines. Also, in a read operation, the row decoder 220 applies a read voltage generated by the voltage generating circuit 210 to a selected word line among the local lines LL in response to the row decoder control signals AD_signals, and applies a pass voltage generated by the voltage generating circuit 210 to the other unselected word lines.

The page buffer group 230 may include a plurality of page buffers PB1 to PBm 231 coupled to the bit lines BL1 to BLm. The page buffers PB1 to PBm 231 may operate in response to page buffer control signals PBSIGNALS. For example, the page buffers PB1 to PBm 231 may temporarily store data to be programmed in a program operation, or sense voltages or currents of the bit lines BL1 to BLm in a read or verify operation.

The column decoder 240 may transfer data between the input/output circuit 250 and the page buffer group 230 in response to a column address CADD. For example, the column decoder 240 may exchange data with the page buffers 231 through data lines DL, or exchange data with the input/output circuit 250 through column lines CL.

The input/output circuit 250 may transfer a command CMD and an address ADD, which are received from the controller 1200 shown in FIG. 1, to the control logic 300, or exchange data DATA with the column decoder 240.

In a read operation or verify operation, the pass/fail check circuit 260 may generate a reference current in response to a allow bit VRY_BIT<#>, and output a pass signal PASS or a fail signal FAIL by comparing a sensing voltage VPB received from the page buffer group 230 with a reference voltage generated by the reference current.

The source line driver 270 may be coupled to a memory cell included in the memory cell array 10 through a source line SL, and control a voltage applied to the source line SL. The source line driver 270 may receive a source line control signal CTRL_SL from the control logic 300, and control a source line voltage applied to the source line SL, based on the source line control signal CTRL_SL.

The control logic 300 may control the peripheral circuit 200 by outputting the operation signal OP_CMD, the row decoder control signals AD_signals, the page buffer control signals PBSIGNALS, and the allow bit VRY_BIT<#> in response to the command CMD and the address ADD. Also, the control logic 300 may determine whether the verify operation has passed or failed in response to the pass or fail signal PASS or FAIL.

In addition, the peripheral circuit 200 may perform program, read, and erase operations of the CAM blocks 12 and 13, like program, read, and erase operations of the memory blocks 11.

Figure 4:
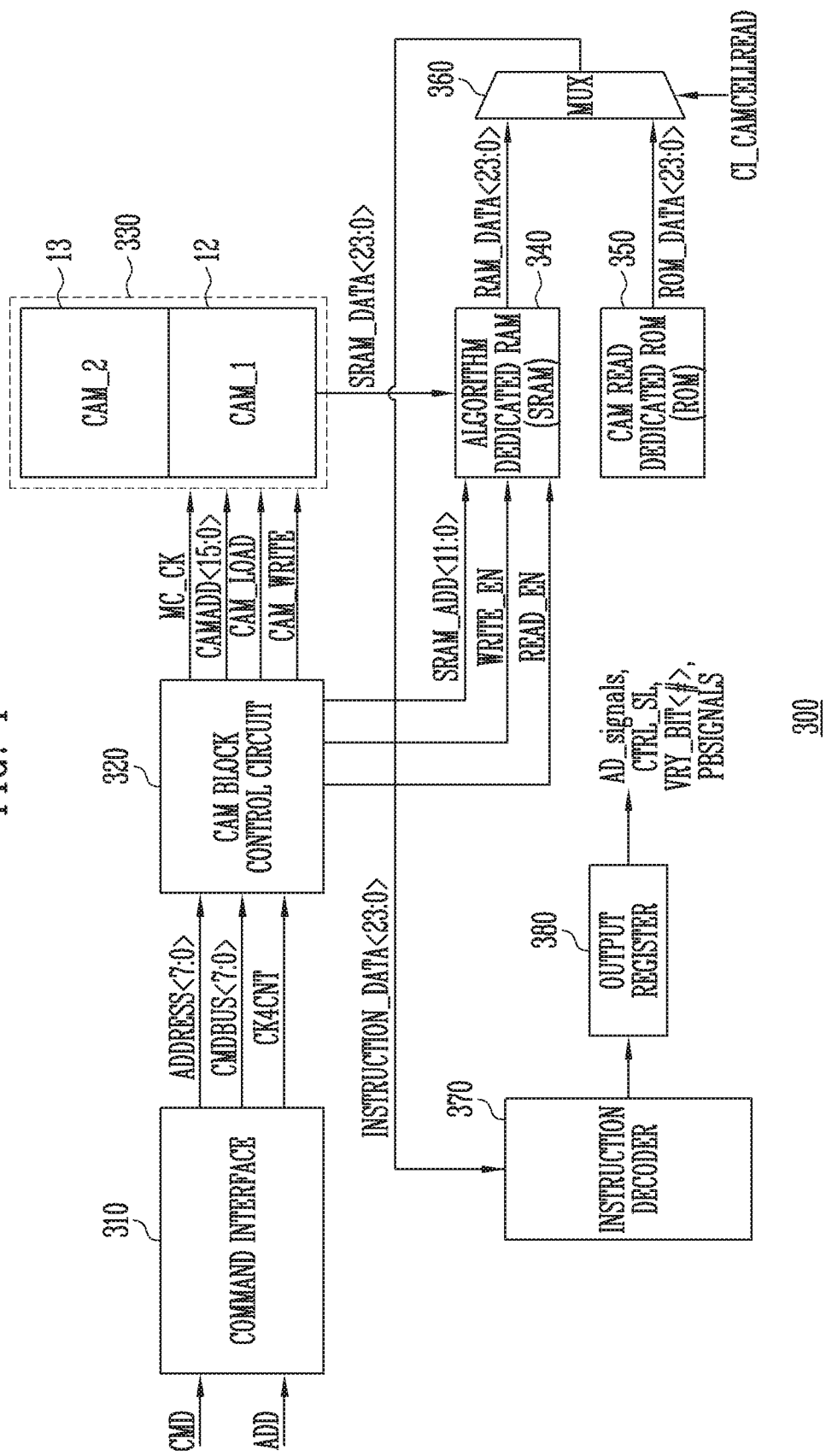
FIG. 4 is a diagram illustrating a control logic shown in FIG. 3.

FIG. 4 is a diagram illustrating the control logic shown in FIG. 3.

Referring to FIG. 4, the control logic 300 may include a command interface 310, a CAM block control circuit 320, an algorithm dedicated RAM SRAM 340, a CAM read dedicated ROM 350, a selection circuit 360, an instruction decoder 370, and an output register 380. In addition, a plurality of CAM blocks configured with the first CAM block CAM_1 12 and the second CAM block CAM_2 13, which are described in FIG. 3, may be included in the control logic 300.

The command interface 310 receives an internal command CMD and an address ADD from the controller 1200 shown in FIG. 2, and generates and outputs an address signal ADDRESS<7:0>, an internal command signal CMDBU<7:0>, and a count clock CK4CNT, which are converted in response to the internal command DMD and the address ADD.

In a micro-code update operation, the CAM block control circuit 320 generates and outputs a CAM address CAMADD<15:0> in response to the address signal ADDRESS<7:0>, generates and outputs a CAM data write signal CAM_WRITE in response to the internal command signal CMDBU<7:0>, and generates and outputs a micro-clock MC_CK in response to the count clock CK4CNT.

In an initialization operation, the CAM block control circuit 320 generates and outputs the CAM address CAMADD<15:0> in response to the address signal ADDRESS<7:0>, generates and outputs a CAM data load signal CAM_LOAD in response to the internal command signal CMDBU<7:0>, and generates and outputs the micro-clock MC_CK in response to the count clock CK4CNT.

Also, in the initialization operation, the CAM block control circuit 320 generates a RAM address signal SRAM_ADD<11:0> and a write enable signal WRITE_EN, and outputs the RAM address signal SRAM_ADD<11:0> and the write enable signal WRITE_EN to the algorithm dedicated RAM 340. In a normal operation, the CAM block control circuit 320 generates the RAM address signal SRAM_ADD<11:0> and a read enable signal READ_EN, and outputs the RAM address signal SRAM_ADD<11:0> and the read enable signal READ_EN to the algorithm dedicated RAM 340.

In the micro-code update operation, the second CAM block 13 programs a micro-code received from the controller 1200 shown in FIG. 2 in response to the CAM address CAMADD<15:0> and the CAM data write signal CAM_WRITE. Subsequently, the first CAM block 12 in which a previous micro-code is stored performs an erase operation, and the micro-code programmed in the second CAM block 13 after the erase operation is completed is copied back to the first CAM block 12 to be programmed in the first CAM block 12.

In the initialization operation, the first CAM block 12 outputs data SRAM_DATA<23:0> read by performing a read operation on a micro-code in response to the CAM address CAMADD<15:0>, the CAM data load signal CAM_LOAD, and the micro-clock MC_CK.

In the initialization operation, the algorithm dedicated RAM 340 receives data SRAM_DATA<23:0> corresponding to the micro-code from the first CAM block 12, and stores the data SRAM_DATA<23:0> in response to the write enable signal WRITE_EN. Subsequently, in the normal operation, the algorithm dedicated RAM 340 reads and outputs the data SRAM_DATA<23:0> in response to the RAM address signal SRAM_ADD<11:0> and the read enable signal READ_EN. The algorithm dedicated RAM 340 may be configured with a Random Access Memory (RAM). Specifically, the algorithm dedicated RAM 340 may be configured with a Static Random Access Memory (SRAM).

The CAM read dedicated ROM 350 stores an algorithm for performing a read operation on the first CAM block CAM_1, and reads and outputs ROM data ROM_DATA<23:0> in the initialization operation. The CAM read dedicated ROM 350 may be configured with a Read Only Memory (ROM).

The selection circuit 360 selects the ROM data ROM_DATA<23:0> output from the CAM read dedicated ROM 350 in response to a selection signal CI_CAMCELLREAD activated in the initialization operation, and outputs the ROM data ROM_DATA<23:0> as instruction data INSTRUCTION_DATA<23:0>. The selection circuit 360 outputs the RAM_DATA<23:0> output from the algorithm dedicated RAM 340 as the instruction data INSTRUCTION_DATA<23:0> in response to the selection signal CI_CAMCELLREAD inactivated in the normal operation.

The instruction decoder 370 generates and outputs a plurality of control signals in response to the instruction data INSTRUCTION_DATA<23:0>. The output register 380 receives the control signals generated by the instruction decoder 370, and outputs the control signals as signals for controlling a general operation of the semiconductor memory 100, such as row decoder control signals AD_signals, a source line control signal CTRL_SL, an allow bit VRY_BIT<#>, and page buffer control signals PBSIGNALS.

Referring to FIG. 4, when a power voltage is supplied to the semiconductor memory such that the semiconductor memory is power up, an initialization operation is performed. In the initialization operation, ROM data ROM_DATA<23:0> stored in the CAM read dedicated ROM 350 is selected to be output as instruction data INSTRUCTION_DATA<23:0>. The instruction decoder 370 generates control signals for controlling an operation of reading a micro-code stored in the first CAM block 12 and storing the micro-code in the algorithm dedicated RAM 340 in response to the instruction data INSTRUCTION_DATA<23:0>. The output register 380 receives control signals, and outputs the control signals as signals such as row decoder control signals AD_signals, a source line control signal CTRL_SL, an allow bit VRY_BIT<#>, and page buffer control signals PBSIGNALS. Accordingly, the peripheral circuit 200 performs a read operation on the first CAM block 12, and the read data SRAM_DATA<23:0> of the first CAM block CAM_1 is loaded to the algorithm dedicated RAM 340.

Subsequently, in a general operation (normal operation) of the semiconductor memory, RAM data RAM_DATA stored in the algorithm dedicated RAM 340 is selected to be output as the instruction data INSTRUCTION_DATA<23:0>. The instruction decoder 370 generates control signals for performing the general operation of the semiconductor memory in response to the instruction data INSTRUCTION_ DATA<23:0>. The output register 380 receives control signals and outputs the control signals as signals such as row decoder control signals AD_signals, a source line control signal CTRL_SL, an allow bit VRY_BIT<#>, and page buffer control signals PBSIGNALS.

Figure 5:
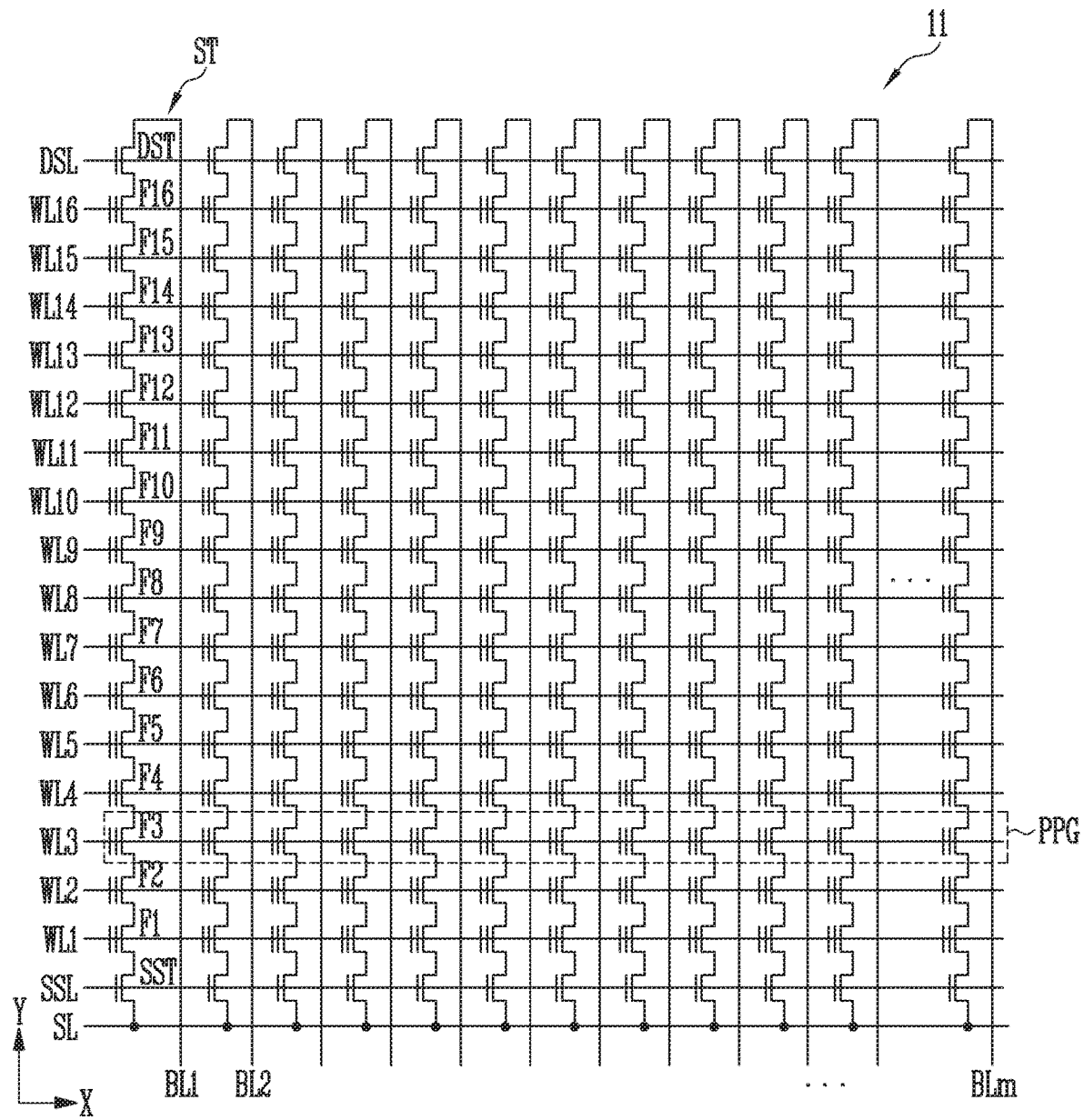
FIG. 5 is a diagram illustrating a memory block shown in FIG. 3.

FIG. 5 is a diagram illustrating a memory block shown in FIG. 3.

Referring to FIG. 5, in the memory block 11, a plurality of word lines arranged in parallel to one another may be coupled between a first select line and a second select line. The first select line may be a source select line SSL, and the second select line may be a drain select line DSL. More specifically, the memory block 11 may include a plurality of strings ST coupled between bit lines BL1 to BLm and a source line SL. The bit lines BL1 to BLm may be coupled to the strings ST, respectively, and the source line SL may be commonly coupled to the strings ST. The strings ST may be configured identically to one another, and therefore, a string ST coupled to a first bit line BL1 will be described in detail as an example.

The string ST may include a source select transistor SST, a plurality of memory cells F1 to F16, and a drain select transistor DST, which are coupled in series to each other between the source line SL and the first bit line BL1. At least one source select transistor SST and at least one drain select transistor DST may be included in one string ST, and a number of memory cells which is larger than the number of memory cells F1 to F16 shown in the drawing may be included in one string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of source select transistors SST included in different strings ST may be coupled to the source select line SSL, gates of drain select transistors DST included in different strings ST may be coupled to the drain select line DSL, gates of the memory cells F1 to F16 included in different strings ST may be coupled to a plurality of word lines WL1 to WL16. A group of memory cells coupled to the same word line among the memory cells included in different strings ST may be a physical page PPG. Therefore, a number of physical pages PPG which corresponds to the number of word lines WL1 to WL16 may be included in the memory block 110.

One memory cell may store data of one bit. The one memory cell is generally referred to as a single level cell (SLC). One physical page PPG may store one logical page (LPG) data. The one LPG data may include data bits corresponding to the number of cells included in one physical page PPG. Also, one memory cell may store data of two or more bits. The one memory cell is generally referred to as a multi-level cell (MLC). One physical page PPG may store two or more LPG data.

Figure 6:
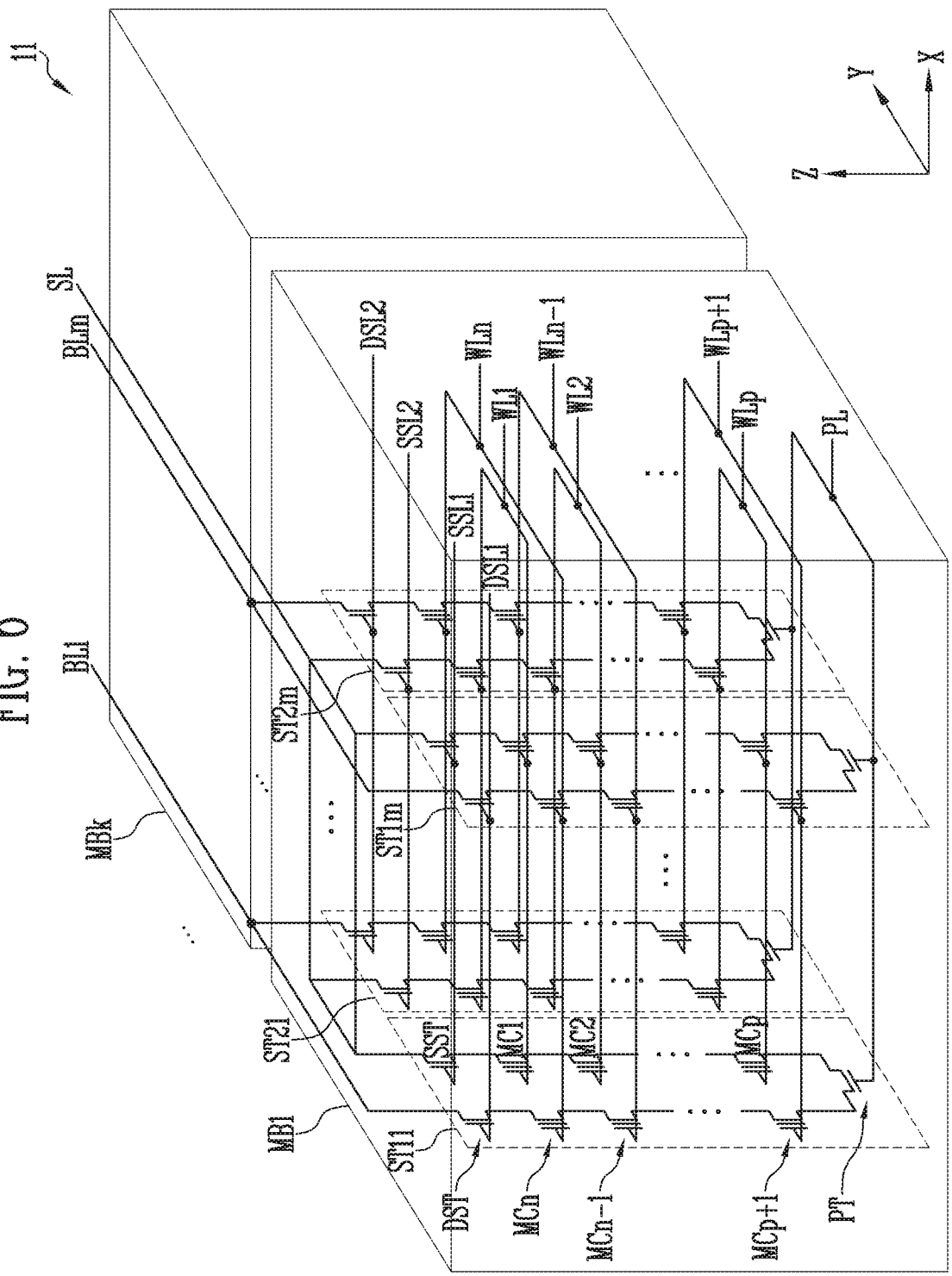
FIG. 6 is a diagram illustrating an embodiment of a three-dimensionally configured memory block.

FIG. 6 is a diagram illustrating an embodiment of a three-dimensionally configured memory block.

Referring to FIG. 6, the memory cell array 10 may include memory blocks MB1 to MBk 11. The memory block 11 may include a plurality of strings ST11 to ST1*m* and ST21 to ST2*m*. In an embodiment, each of the plurality of strings ST11 to ST1*m* and ST21 to ST2*m* may be formed in a 'U' shape. In the memory block 11, m strings may be arranged in a row direction (X direction). Although a case where two strings are arranged in a column direction (Y direction) is illustrated in FIG. 6, this is for convenience of description, and three or more strings may be arranged in the column direction (Y direction).

Each of the plurality of strings ST11 to ST1*m* and ST21 to ST2*m* may include at least one source select transistor SST, first to nth memory cells MC1 to MCn, a pipe transistor PT, and at least one drain select transistor DST.

The source and drain select transistors SST and DST and the memory cells MC1 to MCn may have structures similar to one another. For example, each of the source and drain select transistors SST and DST and the memory cells MC1 to MCn may include a channel layer, a tunnel insulating layer, a charge trapping layer, and a blocking insulating layer. For example, a pillar for providing the channel layer may be provided in each string. For example, a pillar for providing at least one of the channel layer, the tunnel insulating layer, the charge trapping layer, and the blocking insulating layer may be provided in each string.

The source select transistor SST of each string may be coupled between a source line SL and memory cells MC1 to MCp.

In an embodiment, source select transistors of strings arranged in the same row may be coupled to a source select line extending in the row direction, and source select transistors of strings arranged in different rows may be coupled to different source select lines. In FIG. 6, source select transistors of strings ST11 to ST1*m* of a first row may be coupled to a first source select line SSL1. Source select transistors of strings ST21 to ST2*m* of a second row may be coupled to a second source select line SSL2.

In another embodiment, the source select transistors of the strings ST11 to ST1*m* and ST21 to ST2*m* may be commonly coupled to one source select line.

First to nth memory cells MC1 to MCn of each string may be coupled between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a vertical direction (Z direction), and be coupled in series to each other between the source select transistor SST and the pipe transistor PT. The (p+1)th to nth memory cells MCp+1 to MCn may be sequentially arranged in the vertical direction (Z direction), and be coupled in series to each other between the pipe transistor PT and the drain select transistor DST. The first to pth memory cells MC1 to MCp and the (p+1)th to nth memory cells MCp+1 to MCn may be coupled to each other through the pipe transistor PT. Gates of the first to nth memory cells MC1 to MCn of each string may be coupled to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. A gate of the pipe transistor PT of each string may be coupled to a pipe line PL.

The drain select transistor DST of each string may be coupled to a bit line and the memory cells MCp+1 to MCn. Strings arranged in the row direction may be coupled to a drain select line extending in the row direction. Drain select transistors of the strings ST11 to ST1m, of the first row may be coupled to a first drain select line DSL1. Drain select transistors of the strings ST21 to ST2m of the second row may be coupled to a second drain select line DSL2.

Strings arranged in the column direction may be coupled to bit lines extending in the column direction. In FIG. 6, strings ST11 and ST21 of a first column may be coupled to a first bit line BL1. Strings ST1m and ST2m of an mth column may be coupled to an mth bit line BLm.

Memory cells coupled to the same word line among the strings arranged in the row direction may constitute one page. For example, memory cells coupled to the first word line WL1 among the strings ST11 to ST1m of the first row may constitute one page. Memory cells coupled to the first word line WL1 among the strings ST21 to ST2m of the second row may constitute another page. When any one of the drain select lines DSL1 and DSL2 is selected, strings arranged in one row direction may be selected. When any one of the word lines WL1 to WLn is selected, one page among the selected strings may be selected.

Figure 7:
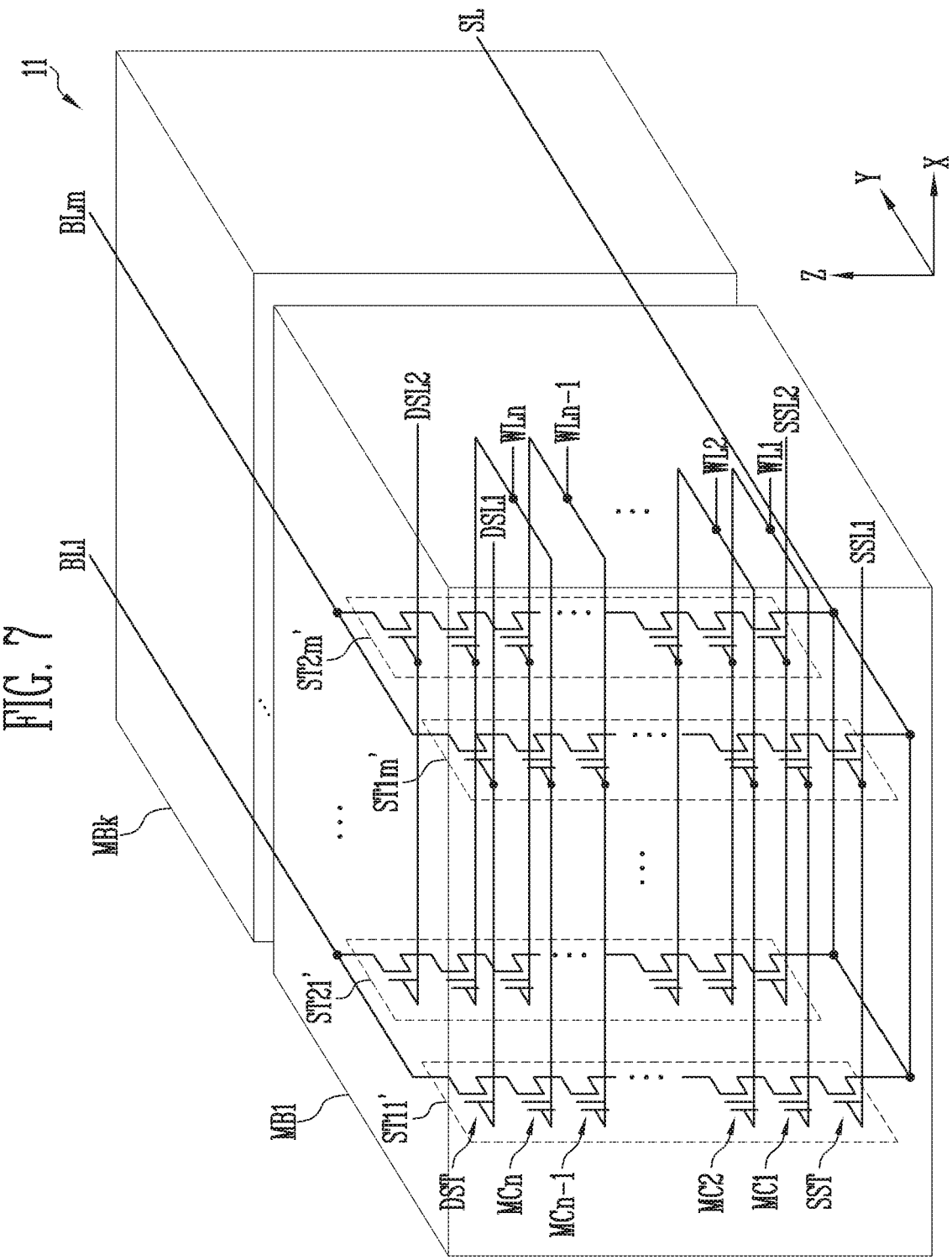
FIG. 7 is a diagram illustrating another embodiment of the three-dimensionally configured memory block.

FIG. 7 is a diagram illustrating another embodiment of the three-dimensionally configured memory block.

Referring to FIG. 7, the memory cell array 10 may include a plurality of memory blocks MB1 to MBk 11. The memory block 11 may include a plurality of strings ST11' to ST1m' and ST21' to ST2m'. Each of the plurality of strings ST11' to ST1m' and ST21' to ST2m' may extend along a vertical direction (Z direction). In the memory block 11, m strings may be arranged in a row direction (X direction). Although a case where two strings are arranged in a column direction (Y direction) is illustrated in FIG. 7, this is for convenience of description, and three or more strings may be arranged in the column direction (Y direction).

Each of the plurality of strings ST11' to ST1m' and ST21' to ST2m' may include at least one source select transistor SST, first to nth memory cells MC1 to MCn, and at least one drain select transistor DST.

The source select transistor SST of each string may be coupled between a source line SL and the memory cells MC1 to MCn. Source select transistors of strings arranged in the same row may be coupled to the same source select line. Source select transistors of strings ST11' to ST1m' arranged on a first row may be coupled to a first source select line SSL1. Source select transistors of strings ST21' to ST2m' arranged on a second row may be coupled to a second source select line SSL2. In another embodiment, the source select transistors of the strings ST11' to ST1m' and ST21' to ST2m' may be commonly coupled to one source select line.

The first to nth memory cells MC1 to MCn of each string may be coupled in series to each other between the source select transistor SST and the drain select transistor DST. Gates of the first to nth memory cells MC1 to MCn may be coupled to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. Accordingly, the reliability of data stored in the memory block 11 can be improved.

The drain select transistor DST of each string may be coupled between a bit line and the memory cells MC1 to MCn. Drain select transistors DST of strings arranged in the row direction may be coupled to a drain select line extending in the row direction. The drain select transistors DST of the strings ST11' to ST1m' of the first row may be coupled to a first drain select line DSL1. The drain select transistors DST of the strings ST21' to ST2m' of the second row may be coupled to a second drain select line DSL2.

Figure 8:
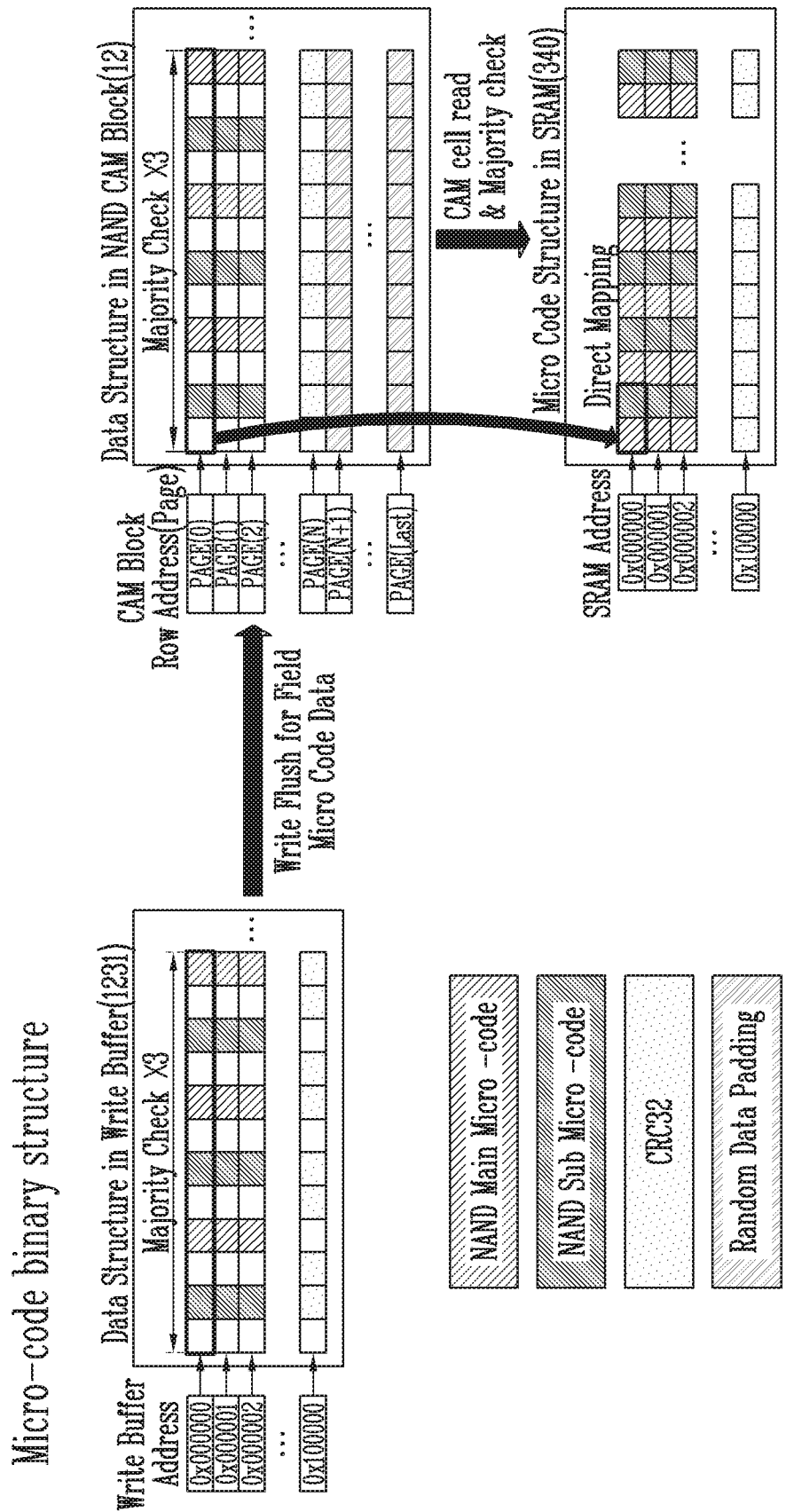
FIG. 8 is a diagram illustrating a micro-code data structure.

FIG. 8 is a diagram illustrating a data structure of a micro-code buffered to the write buffer 1231 shown in FIG. 2, a data structure of a micro-code programmed in the CAM block 12 shown in FIG. 3, and a data structure of a micro-code stored in the algorithm dedicated RAM 340 shown in FIG. 4.

Referring to FIG. 8, the micro-code buffered to the write buffer 1231 is configured with a main micro-code data, sub micro-code data, a CRC code CRC32, and random data padding, and the same micro-code is consecutively stored plural times (e.g., three times) in one buffer area (e.g., 0x000000). This is for the purpose of minimizing an error of micro-code data by consecutively programming the same micro-code plural times, reading the micro-code programed the plural times in a read operation, and performing a majority check operation of selecting as normal micro-code data a micro-code, a data value of which is repeated the greatest number of times among the plurality of read micro-codes.

The micro-code buffered in the write buffer 1231 is stored in the CAM block (e.g., the first CAM block 12 shown in FIG. 13). In an example, a micro-code buffered to one buffer area (e.g., 0x000000) may be stored in one page (e.g., PAGE(0)) of the CAM block. That is, micro-codes buffered to areas 0x000000, 0x000001, and 0x000002 of the write buffer are programmed in PAGE(0), PAGE(1), and PAGE(2) of the CAM block, respectively.

Subsequently, in an initialization operation, the micro-codes stored in the CAM block are read to be stored in the algorithm dedicated RAM SRAM 340 shown in FIG. 4. Micro-code data repeatedly stored in one page of the CAM block are read as one micro-code by a majority check, and a micro-code configured with the main micro-code data and the sub micro-code data except the CRC code CRC32 and the random data padding within the read single micro-code is stored in the algorithm dedicated RAM SRAM. That is, a micro-code repeatedly stored in the PAGE(0) of the CAM block are read then stored in a portion of the buffer area (0x000000) of the algorithm dedicated RAM SRAM.

Figure 9:
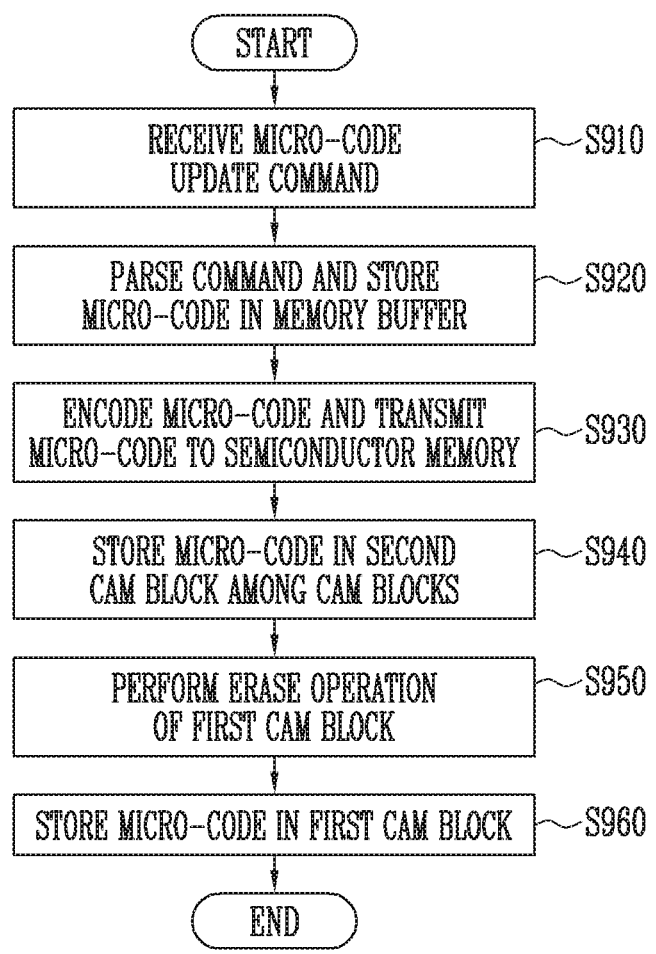
FIG. 9 is a flowchart illustrating an operation of the memory system in accordance with an embodiment of the present disclosure.

FIG. 9 is a flowchart illustrating a micro-code update operation of the memory system 1000 in accordance with an embodiment of the present disclosure.

Figure 10:
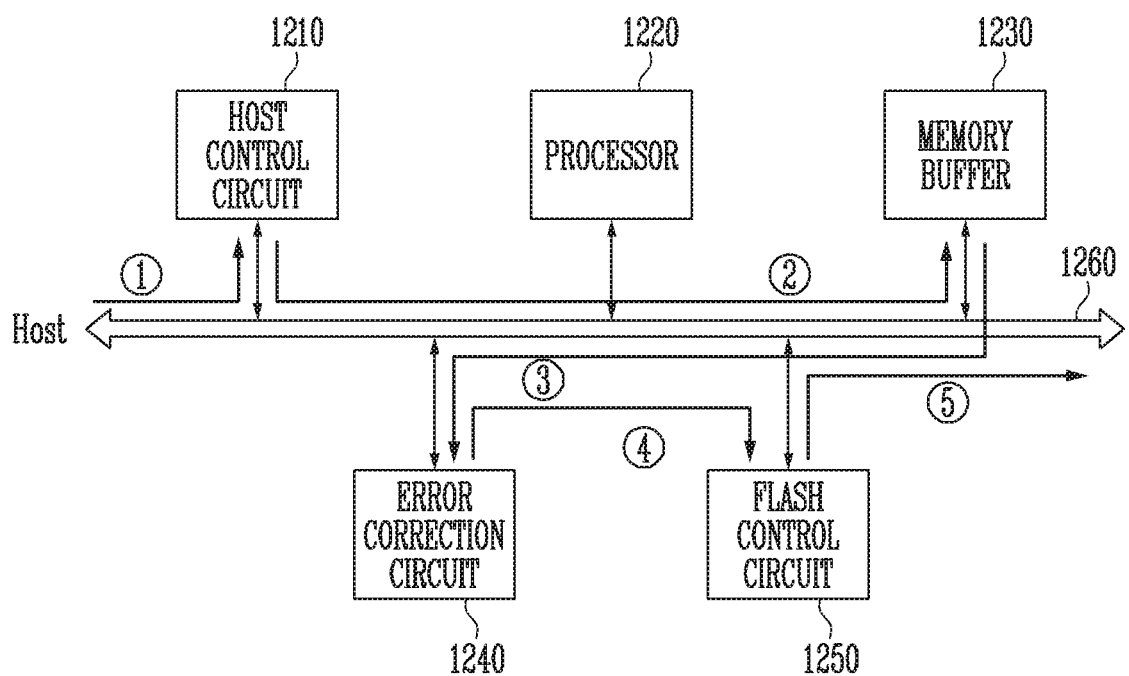
FIG. 10 is a data flowchart illustrating an operation of the controller.

FIG. 10 is a diagram illustrating a data flow in the controller 1200 in the micro-code update operation in accordance with an embodiment of the present disclosure.

The micro-code update operation of the memory system 1000 in accordance with the embodiment of the present disclosure will be described as follows with reference to FIGS. 1 to 3, 9, and 10.

The semiconductor memories 100 include the first and second CAM blocks 12 and 13. The first CAM block 12 is a CAM block in which a micro-code is stored, and the second CAM block 13 is a CAM block in an erase state.

When a command FFU for requesting an update operation of the micro-code, that is firmware stored in the semiconductor memories 100 included in the memory device 1100, is received from the host 1400 (S910), the host control circuit 1210 of the controller 1200 parses the received command FFU, receives an updated micro-code, which is received together with the command FFU (①), and stores the updated micro-code in the memory buffer 1230 (②) (S920).

The processor 1220 of the controller 1200 queues commands according to the parsed command FFU, and generates a descriptor for controlling the flash control circuit 1250 according to the queued commands. Also, the processor 1220 may generate a mapped address.

The error correction circuit 1240 receives the updated micro-code buffered to the memory buffer 1230 (③), and encodes and scrambles the updated micro-code. The flash control circuit 1250 generates an internal command CMD for controlling the memory device 1100 in response to the descriptor generated by the processor 1220, and receives the updated micro-code encoded and scrambled by the error correction circuit 1240 (④) to transmit the internal command CMD, the updated micro-code, and the mapped address ADD to a selected semiconductor memory 100 of the memory device 1100 (⑤) (S930).

The selected semiconductor memory 100 programs the updated micro-code in the second CAM block 13 in the erase state among the plurality of CAM blocks 12 and 13 in response to the internal command CMD and the address ADD, which are received from the controller 1200 (S940).

Subsequently, an erase operation of the first CAM block 12 in which the existing micro-code has been stored is performed (S950).

When the erase operation of the first CAM block 12 is completed, the updated micro-code stored in the second CAM block is copied in the first CAM block 12 (S960).

In a subsequent power-up operation of the memory system, the updated micro-code stored in the first CAM block 12 is stored in the algorithm dedicated RAM 340 included in the control logic 300, to be used in a general operation of the semiconductor memory 100.

As described above, in accordance with the embodiment of the present disclosure, the micro-code update operation can be performed by storing, in the CAM block, a micro-code stored in the semiconductor memory 100 through the host 1400.

Figure 11:
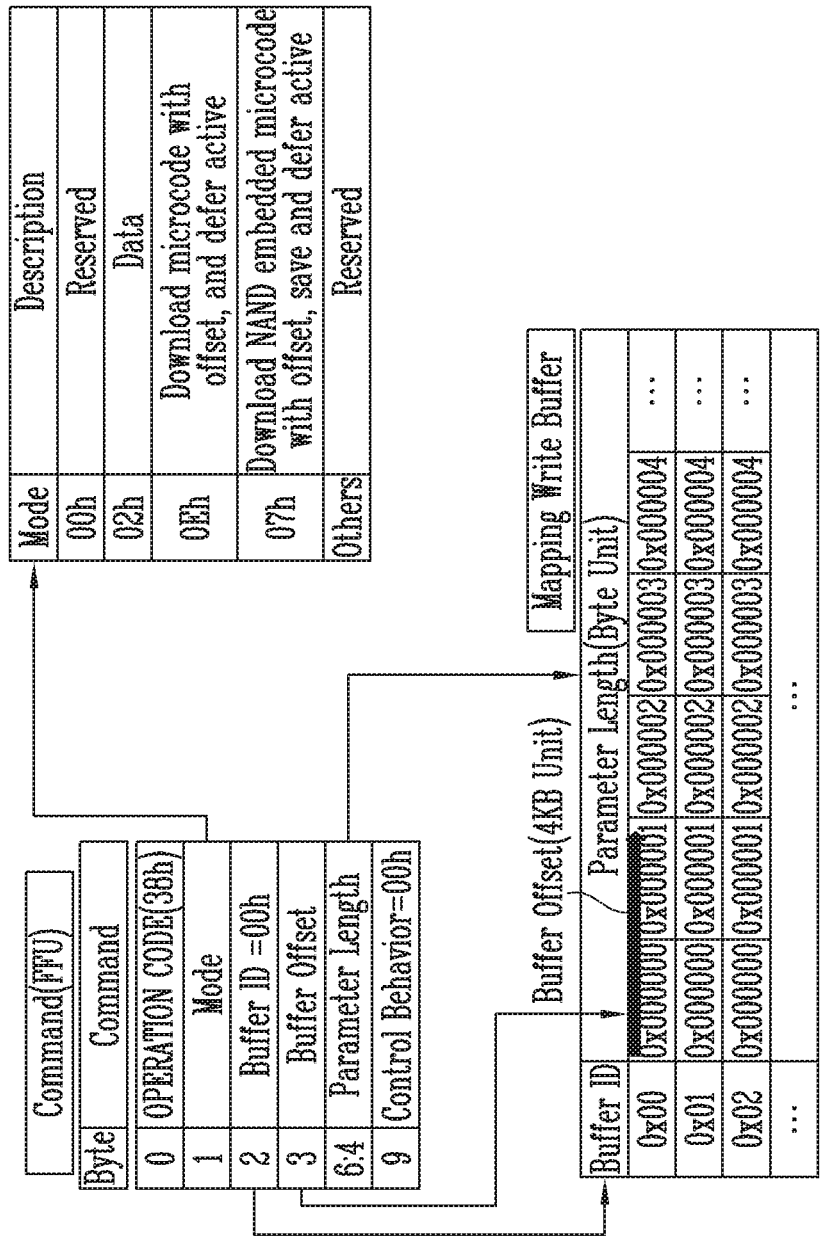
FIG. 11 a diagram illustrating a command structure.

FIG. 11 a diagram illustrating a structure of a command for requesting a micro-code update, which is received from the host.

Referring to FIG. 11, the command received from the host may include an operation code OPERATION CODE(38h), a mode MODE, a buffer ID Buffer ID, a buffer offset Buffer Offset, a parameter data length Parameter Length, and a control behavior Control Behavior. The host control circuit 1210 and the processor 1220, which are shown in FIG. 2, may perform a mapping operation for buffering a micro-code to the write buffer 1231 shown in FIG. 2 in response to the buffer ID Buffer ID, the buffer offset Buffer Offset, and the parameter data length Parameter Length.

The controller 1200 shown in FIG. 2 receives a command FFU from the host 1400, receives data corresponding to the micro-code by a certain size whenever a response signal with respect to the command FFU is prepared, and stacks and stores data corresponding to the received micro-code in the write buffer 1231 shown in FIG. 2.

Figure 12:
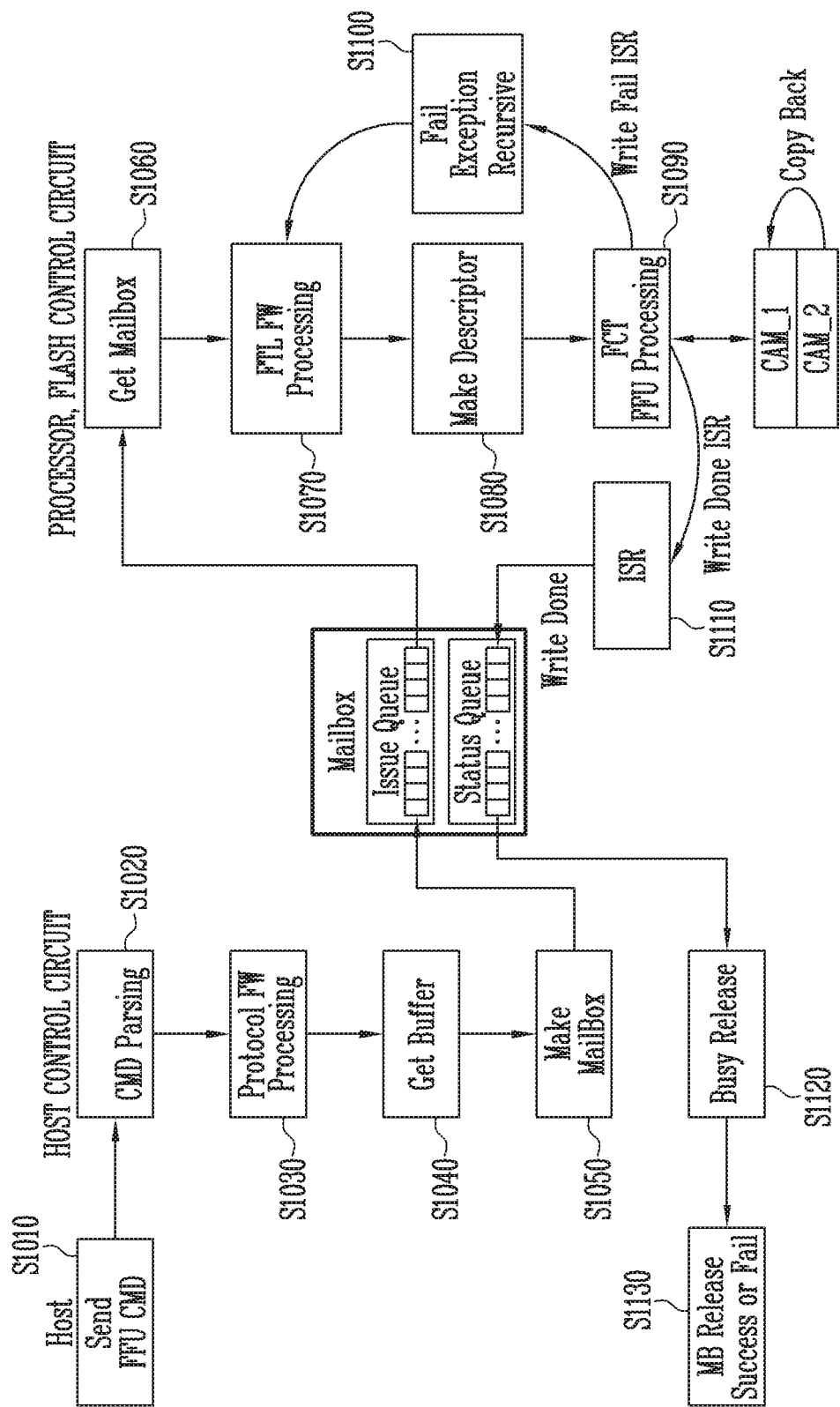
FIG. 12 is a flowchart illustrating an operation of the controller.

FIG. 12 is a flowchart illustrating an operation of the controller 1200.

The operation of the controller will be described as follows with reference to FIGS. 2 and 12.

When a command FFU for requesting an update operation of a micro-code, that is, firmware stored in the semiconductor memories, is received from the host 1400 (S1010), the host control circuit 1210 parses the command FFU (S1020), and drives protocol firmware Protocol FW (S1030).

Also, the host control circuit 1210 allocates a storage space of the write buffer 1231 of the memory buffer 1230, in which an updated micro-code received together with the command FFU is stored, and stores the updated micro-code in the allocated storage space (S1040).

The processor 1220 generates a mail box according to the parsed command FFU (S1050), and generates an issue queue by queuing commands in the mail box (S1060).

The processor 1220 drives FTL firmware according to the issue queue generated in the mail box (S1070), and generates a plurality of descriptors for controlling the flash control circuit 1250 (S1080). The plurality of descriptors may respectively correspond to a program operation, an erase operation, a copy operation, and the like of a CAM block.

The flash control circuit 1250 controls the memory device 1100 to perform a micro-code update operation in response to the plurality of descriptors (S1090).

In the micro-code update operation, the micro-code in the second CAM block CAM_2 in the erase state is programmed, and the first CAM block CAM_1 in which a previous micro-code has been stored is erased. Subsequently, the micro-code stored in the second CAM block CAM_2 is copied in the first CAM block CAM_1 in the erase state.

In the micro-code update operation, when a fail Write Fail occurs in the program operation of the micro-code, the flash control circuit 1250 generates an Interrupt Service Routine (ISR) with respect to the fail. When it is determined that the fail consecutively occurs according to ISR (S1100), this is notified to the processor 1220, thereby re-performing the above-described steps from the step S1070.

When the micro-code update operation is successfully performed in the memory device 1100, the flash control circuit 1250 generates an ISR corresponding to write completion (S1110), and queues the ISR in a status queue Status Queue of the mail box.

Subsequently, the host control circuit 1210 cancels a busy state Busy of the memory system according to the status queue Status Queue of the mail box (S1120), releases data corresponding to the micro-code stored in the write buffer 1231 of the memory buffer 1230, and outputs a response signal for notifying success or fail of the micro-code update operation to the host 1400.

FIG. 13 is a diagram illustrating a mapping table of a micro-code of a semiconductor memory having a multi-plane structure.

Figure 14:
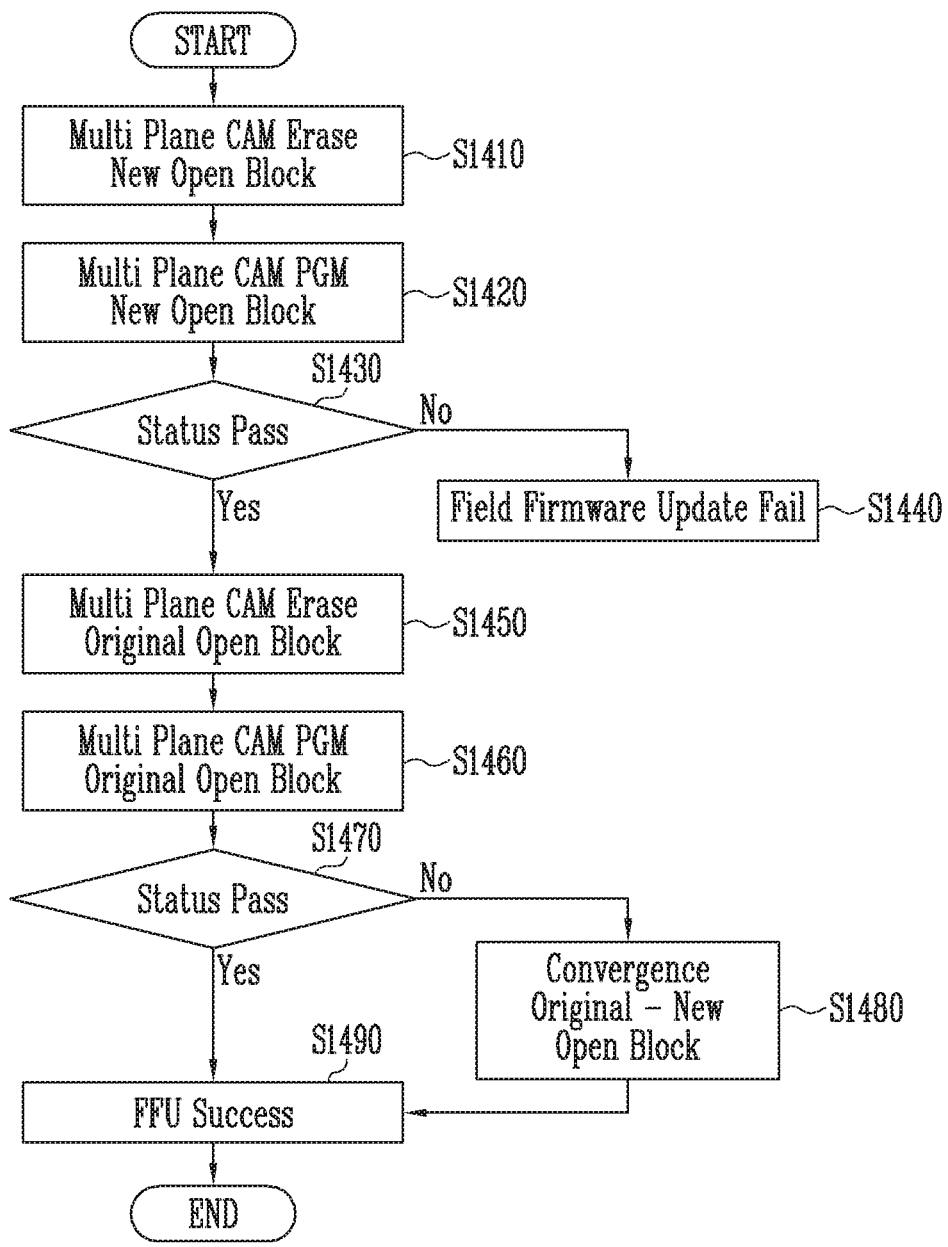
FIG. 14 is a flowchart illustrating a micro-code update operation of a CAM block.

FIG. 14 is a flowchart illustrating a micro-code update operation of a CAM block.

The micro-code update operation of the CAM block of the semiconductor memory will be described as follows with reference to FIGS. 13 and 14.

For example, in the case of a semiconductor memory having a structure of four planes, each plane has a first CAM block CAM_1 and a second CAM block CAM_2, and may include an additional CAM block.

The first CAM block CAM_1 is defined as a micro-code original block in which an original micro-code is stored, and the second CAM block CAM_2 is defined as a new micro-code block selected from an open block in the micro-code update operation.

When the second CAM block CAM_2 is selected, and is not an open block in the erase state, an erase operation is performed (S1410).

Subsequently, a micro-code is programmed in the second CAM block CAM_2 in the erase state (S1420).

A status of a program operation is determined (S1430). As the determination result, when the program operation is determined as Fail (No), an update operation of the micro-code, i.e., Field Firmware Update (FFU) is determined as Fail (S1440).

As the determination result, when the program operation is determined as Pass (Yes), an erase operation of the first CAM block CAM_1 in which the original micro-code is stored is performed (S1450).

Subsequently, a copy operation of reading the updated micro-code, which is stored in the second CAM block CAM_2 and programming the updated micro-code in the first CAM block CAM_1 is performed (S1460).

A status of the copy operation is determined (S1470). As the determination result, when the copy operation is determined as Fail (No), a convergence block operation of defining the second CAM block CAM_2 as a micro-code original block and defining the first CAM block CAM_1 as a new micro-code block is performed (S1480). As the determination result, when the copy operation is determined as Pass (Yes), it is determined that the update operation of the micro-code, i.e., the FFU has succeeded, and the micro-code update operation is ended (S1490). After the convergence block operation is performed (S1490), it is determined that the micro-code update operation has succeeded, and the micro-code update operation is ended.

In an embodiment of the present disclosure, an additional CAM block may be configured in addition to the first CAM block CAM_1 and the second CAM block CAM_2. The additional CAM block may store fail information of blocks, column repair information, bad block information, and the like.

Figure 15:
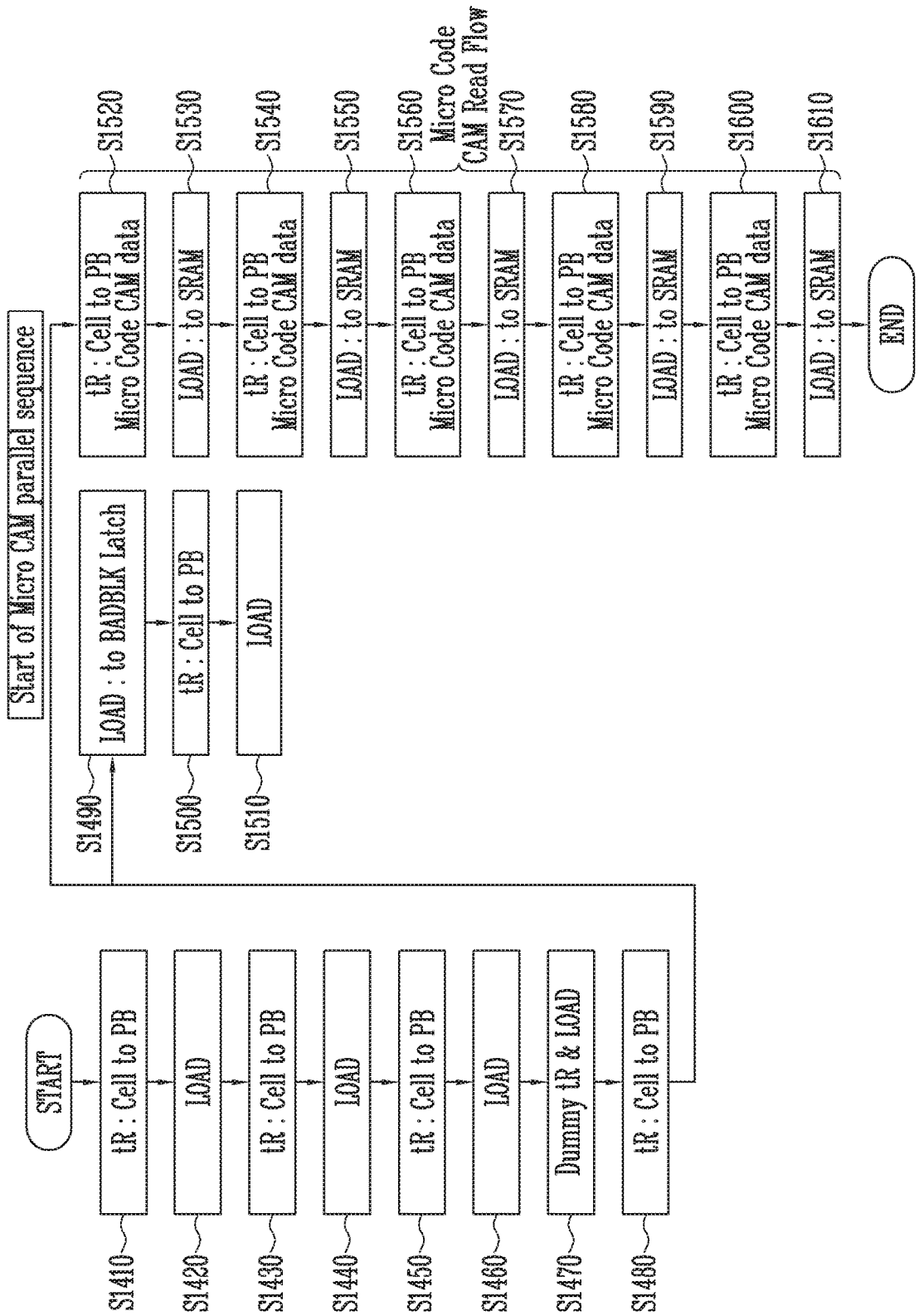
FIG. 15 is a flowchart illustrating a read operation of a CAM block.

FIG. 15 is a flowchart illustrating a read operation of a CAM block.

Referring to FIGS. 13 and 15, steps S1410 to S1510 of reading repair information, bad block information, and the like, which are stored in an additional CAM block of a plurality of multi-planes are performed. The read operation of the additional CAM block sequentially performs an operation of reading data to a page buffer by sequentially reading pages and an operation of loading the data read to the page buffer into the control logic 300.

Subsequently, in the read operation of the CAM block, micro-codes stored in a plurality of pages of the first CAM block CAM_1 defined as a micro-code original block are sequentially read, and then loaded into the algorithm dedicated RAM 340 shown in FIG. 4 (S1520 to S1610). For example, a micro-code stored in one page is read to the page buffer (S1520), and then loaded into the algorithm dedicated RAM 340 from the page buffer (S1530). Subsequently, read and load operations of a micro-code stored in a next page are sequentially repeatedly performed.

In order to reduce latency of the read operation, a read operation of the second CAM block may be performed together with that of the first CAM block. The second CAM block stores the same micro-code as the first CAM block in the micro-code update operation.

Thus, when read data is transmitted to the algorithm dedicated RAM 340 after the read operation of the first CAM block is performed, the second CAM block read a next micro-code. Subsequently, when data read from the second CAM block is transmitted to the algorithm dedicated RAM 340, a read operation of a next micro-code of the first CAM block is performed. Accordingly, the read operation and the load operation are performed in a cache manner, so that read latency can be reduced.

Figure 16:
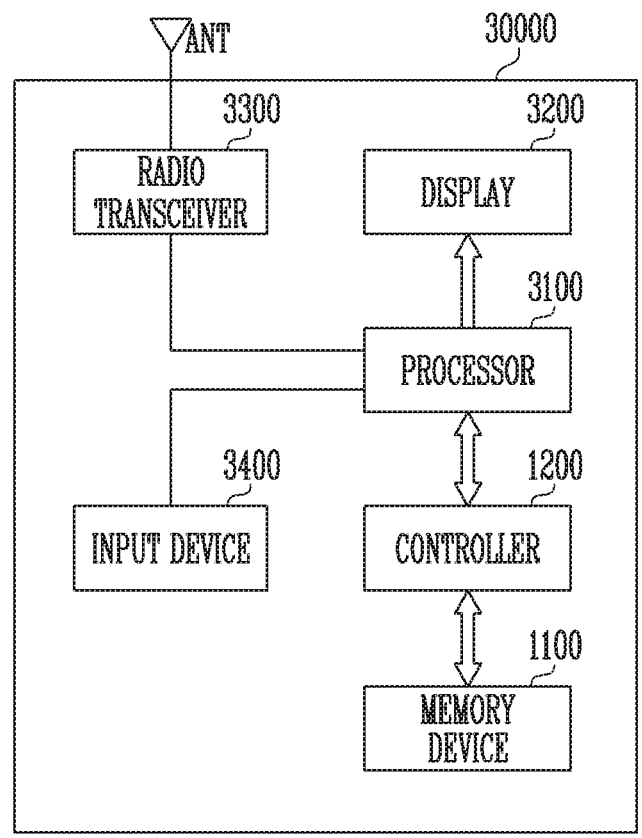
FIG. 16 is a diagram illustrating an embodiment of the memory system.

FIG. 16 is a diagram illustrating another embodiment of the memory system.

Referring to FIG. 16, the memory system 30000 may be implemented as a cellular phone, a smart phone, a tablet PC, a personal digital assistant (PDA), or a wireless communication device. The memory system 30000 may include a memory device 1100 and a controller 1200 capable of controlling an operation of the memory device 1100. The controller 1200 may control a data access operation of the memory device 1100, e.g., a program operation, an erase operation, a read operation, or the like under the control of a processor 3100.

Data programmed in the memory device 1100 may be output through a display 3200 under the control of the controller 1200.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the controller 1200 or the display 3200. The controller 1200 may transmit the signal processed by the processor 3100 to the memory device 1100. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mouse, a keypad, or a keyboard. The processor 3100 may control an operation of the display 3200 such that data output from the controller 1200, data output from the radio transceiver 3300, or data output from the input device 3400 can be output through the display 3200.

In some embodiments, the controller 1200 capable of controlling an operation of the memory device 1100 may be implemented as a part of the processor 3100, or be implemented as a chip separate from the processor 3100. Also, the controller 1200 may be implemented with the controller shown in FIG. 2.

Figure 17:
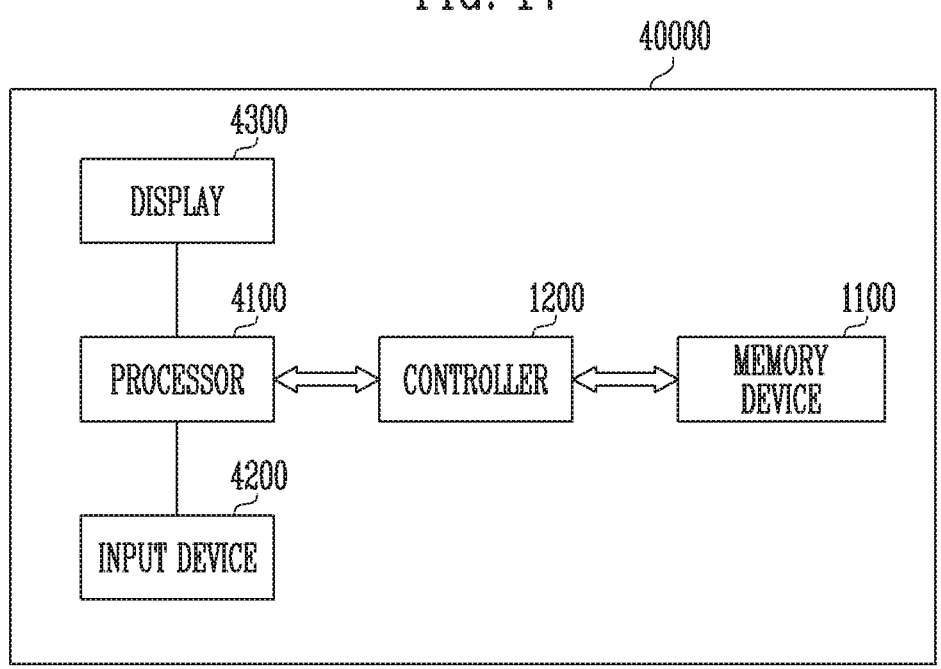
FIG. 17 is a diagram illustrating an embodiment of the memory system.

FIG. 17 is a diagram illustrating another embodiment of the memory system.

Referring to FIG. 17, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 1100 and a controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad, a computer mouse, a keypad, or a keyboard.

The processor 4100 may control overall operations of the memory system 40000, and control an operation of the controller 1200. In some embodiments, the controller 1200 capable of controlling an operation of the memory device 1100 may be implemented as a part of the processor 4100, or be implemented as a chip separate from the processor 4100. Also, the controller 1200 may be implemented with the controller shown in FIG. 2.

Figure 18:
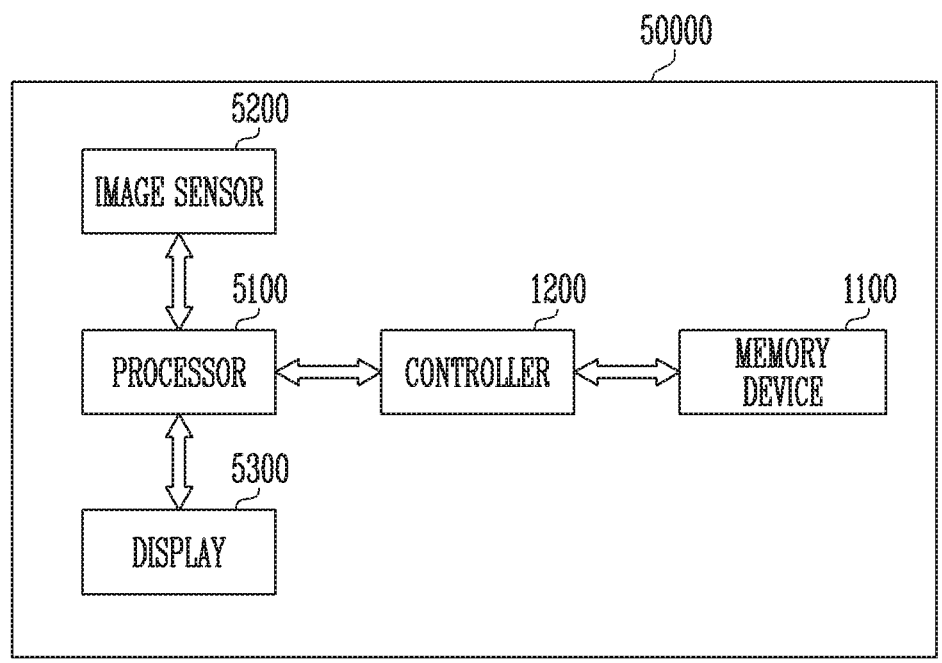
FIG. 18 is a diagram illustrating an embodiment of the memory system.

FIG. 18 is a diagram illustrating another embodiment of the memory system.

Referring to FIG. 18, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the controller 1200. Under the control of the processor 5100, the converted digital signals may be output through a display 5300, or be stored in the memory device 1100 through the controller 1200. In addition, data stored in the memory device 1100 may be output through the display 5300 under the control of the processor 5100 or the controller 1200.

In some embodiments, the controller 1200 capable of controlling an operation of the memory device 1100 may be implemented as a part of the processor 5100, or be implemented as a chip separate from the processor 5100. Also, the controller 1200 may be implemented with the controller shown in FIG. 2.

Figure 19:
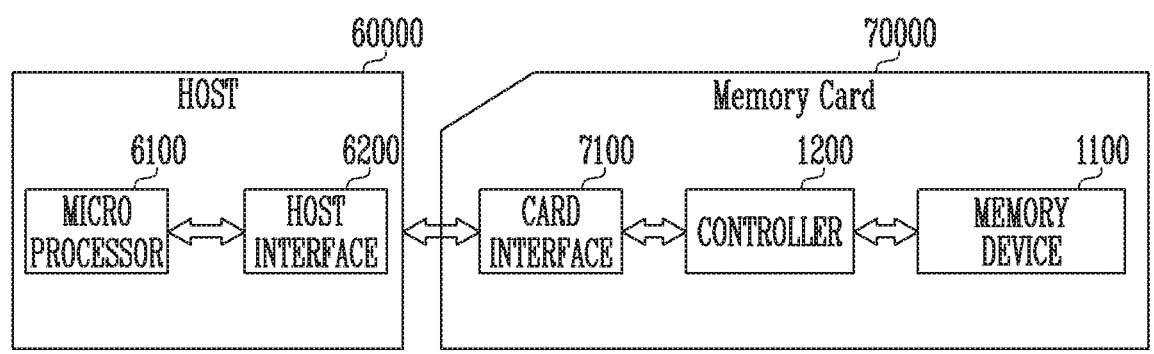
FIG. 19 is a diagram illustrating an embodiment of the memory system.

FIG. 19 is a diagram illustrating another embodiment of the memory system.

Referring to FIG. 19, the memory system 70000 may be implemented as a memory card or a smart card. The memory system 70000 may include a memory device 1100, a controller 1200, and a card interface 7100.

The controller 1200 may control data exchange between the memory device 1100 and the card interface 7100. In some embodiments, the card interface 7100 may be a secure digital (SD) card interface or a multi-media card (MMC) interface, but the present disclosure is not limited thereto. Also, the controller 1200 may be implemented with the controller shown in FIG. 2.

The card interface 7100 may interface data exchange between a host 60000 and the controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the controller 1200 under the control of a microprocessor 6100.

In accordance with the present disclosure, an updated micro-code received through the host is stored in a CAM block of the semiconductor memory, and an original micro-code stored in another CAM block is updated to the new micro-code, so that an algorithm stored in the semiconductor memory can be easily corrected without any additional component.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
   a first CAM block and a second CAM block, in which a micro-code is stored; and
   a control logic configured to control the first and second CAM blocks such that the stored micro-code is updated with a new micro-code in a micro-code update operation,
   wherein the control logic includes:
   a command interface configured to control program and read operations of the first CAM block and the second CAM block in response to a command received from the outside;
   a first memory configured to store an algorithm for performing the read operation of the micro-code stored in the first CAM block, and output read only memory (ROM) data, based on the algorithm, in an initialization operation;
   a second memory configured to store the micro-code read from the first CAM block in the initialization operation, and output random access memory (RAM) data, based on the stored micro-code;
   a selection circuit configured to select and output the ROM data output from the first memory in the initialization operation, and select and output the RAM data output from the second memory in a normal operation; and
   an instruction decoder configured to receive the ROM data or the RAM data, which is output from the selection circuit, to generate control signals for performing an operation.

2. The memory device of claim 1, wherein the first memory is configured with a ROM, and the second memory is configured with a RAM.

3. The memory device of claim 1, further comprising a peripheral circuit configured to perform the program operation and the read operation on the first CAM block and the second CAM block.

4. The memory device of claim 3,
wherein the peripheral circuit stores the micro-code in a plurality of pages included in each of the first CAM block and the second CAM block, and
wherein a plurality of same micro-codes are programmed to be stored in each of the plurality of pages.

5. The memory device of claim 4, wherein the peripheral circuit reads the plurality of same micro-codes as one micro-code through a majority check in the read operation on the first CAM block.

6. The memory device of claim 2, wherein the micro-code is configured with main micro-code data, sub micro-code data, a Cyclic Redundancy Check (CRC code, and random data.

7. The memory device of claim 6, wherein the second memory stores only the main micro-code data and the sub micro-code data in the micro-code.

8. A memory system comprising:
a memory device including a plurality of semiconductor memories, wherein each of the plurality of semiconductor memories performs an operation based on a micro-code; and
a controller configured to receive a micro-code update command and a new micro-code from a host, and transmit the micro-code update command and the new micro-code to the memory device,
wherein each of the plurality of semiconductor memories stores the new micro-code received from the controller in first and second CAM blocks in a micro-code update operation, and reads the new micro-code stored in the first CAM block and then load the read new micro-code into an algorithm dedicated random access memory (RAM) in an initialization operation, and
wherein each of the plurality of semiconductor memories includes:
the first CAM block and the second CAM block, in which the micro-code is stored;
a plurality of memory blocks;
a peripheral circuit configured to perform a program operation and a read operation on the first CAM block and the second CAM block; and
a control logic configured to control the peripheral circuit to perform an operation on the plurality of memory blocks, and store the new micro-code in the second CAM block and copy the new micro-code from the second CAM block into the first CAM block in the micro-code update operation.

9. The memory system of claim 8, wherein the control logic includes:
a CAM block control circuit configured to control the program operation and the read operation of the first CAM block and the second CAM block;
a CAM read dedicated ROM configured to store an algorithm for performing the read operation of the micro-code stored in the first CAM block, and output ROM data, based on the algorithm in the initialization operation;
an algorithm dedicated RAM configured to store the micro-code read from the first CAM block in the initialization operation, and output RAM data, based on the micro-code, in the general operation; and
an instruction decoder configured to selectively receive the ROM data and the RAM data to generate control signals for controlling the peripheral circuit.

10. The memory system of claim 9, wherein the control logic further includes a selection circuit configured to transmit the ROM data to the instruction decoder in the initialization operation, and transmit the RAM data to the instruction decoder in the general operation.

11. The memory system of claim 8,
wherein the peripheral circuit stores the micro-code in a plurality of pages included in each of the first CAM block and the second CAM block, and
wherein a plurality of same micro-codes are programmed to be stored in each of the plurality of pages.

12. The memory system of claim 11, wherein the peripheral circuit reads the plurality of same micro-codes as one micro-code through a majority check in the read operation on the first CAM block.

13. The memory system of claim 9, wherein the micro-code is configured with main micro-code data, sub micro-code data, a CRC code, and random data.

14. The memory system of claim 13, wherein the algorithm dedicated RAM stores only the main micro-code data and the sub micro-code data in the micro-code.

15. A method for operating a memory device, the method comprising:
receiving a micro-code update command and a new micro-code from a host;
storing the new micro-code in a second CAM block of a semiconductor memory in response to the micro-code update command;
performing an operation of erasing a first CAM block in which an original micro-code is stored, and copying the new micro-code from the second CAM block to the first CAM block;
performing a read operation of the first CAM block based on an algorithm stored in a CAM read dedicated ROM in an initialization operation;
selecting read only memory (ROM) data outputted from the CAM read dedicated ROM in the initialization operation;
storing a micro-code read from the first CAM block in an algorithm dedicated RANI;
selecting RAM data outputted from the algorithm dedicated RAM during a normal operation; and
controlling a peripheral circuit, based on the micro-code stored in the algorithm dedicated RAM in the normal operation.

16. The method of claim 15, wherein, when a status fail of the first CAM block occurs as a result obtained by performing the copy operation, the second CAM block is defined as an original micro-code block, and a convergence block operation of erasing the first CAM block is performed.

17. The method of claim 15, wherein a majority check operation is performed on the micro-code read from the first CAM block.

18. The method of claim 15,
wherein the micro-code stored in the first CAM block includes main micro-code data, sub micro-code data, a Cyclic Redundancy Check (CRC) code, and random data, and
wherein the micro-code stored in the algorithm dedicated RAM includes only the main micro-code data and the sub micro-code data.

* * * * *